(12) United States Patent
Nigam et al.

(10) Patent No.: US 9,390,793 B1
(45) Date of Patent: Jul. 12, 2016

(54) LEAKAGE CURRENT COMPENSATION WITH REFERENCE BIT LINE SENSING IN NON-VOLATILE MEMORY

(71) Applicant: SanDisk 3D LLC, Milpitas, CA (US)

(72) Inventors: Anurag Nigam, San Jose, CA (US); Yingchang Chen, Cupertino, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/663,786

(22) Filed: Mar. 20, 2015

(51) Int. Cl.
*G11C 7/00* (2006.01)
*G11C 13/00* (2006.01)

(52) U.S. Cl.
CPC .......... *G11C 13/0038* (2013.01); *G11C 13/004* (2013.01); *G11C 2013/0054* (2013.01)

(58) Field of Classification Search
CPC .............................. G11C 7/02; G11C 11/4091
USPC .................................. 365/206, 207, 208, 149
See application file for complete search history.

(56) References Cited

U.S. PATENT DOCUMENTS

| | | | |
|---|---|---|---|
| 6,813,209 B2 | 11/2004 | Crain et al. | |
| 6,950,361 B2 | 9/2005 | Kamoshida et al. | |
| 7,116,598 B2 * | 10/2006 | Shimizu | G11C 7/062 365/158 |
| 7,167,393 B2 | 1/2007 | Oikawa et al. | |
| 8,050,092 B2 | 11/2011 | Jung et al. | |
| 2011/0216601 A1 * | 9/2011 | Liao | G11C 7/02 365/185.21 |

OTHER PUBLICATIONS

U.S. Appl. No. 14/663,775, filed Mar. 20, 2015.
R. Fackenthal, et al., "A 16Gb ReRAM with 200MB/s Write and 16GB/s Read in 27nm Technology," ISSCC Digest of Technical Papers, Feb. 2014, pp. 338-339.
U.S. Appl. No. 14/539,150, filed Nov. 12, 2014.

* cited by examiner

*Primary Examiner* — Son Dinh
(74) *Attorney, Agent, or Firm* — Vierra Magen Marcus LLP

(57) ABSTRACT

A non-volatile memory includes a sense amplifier that uses a reference bit line. The sense amplifier includes a first capacitor coupled to a selected bit line and a second capacitor coupled to a reference bit line. The reference capacitor compensates for displacement currents in the selected bit line during sensing. Both plates of the capacitors are utilized to cancel leakage currents. The top plates of the capacitors are precharged then discharged during a sense phase. The selected bit line capacitor is discharged based on the selected cell current and the leakage current. The amount of discharge is transferred to the bottom plate of each capacitor, followed by discharging the bottom plates. The capacitor for the selected bit line is discharged based on the leakage current. In this manner, the correction phase facilitates a compensation based on the leakage current so that the selected cell current can be determined.

27 Claims, 22 Drawing Sheets

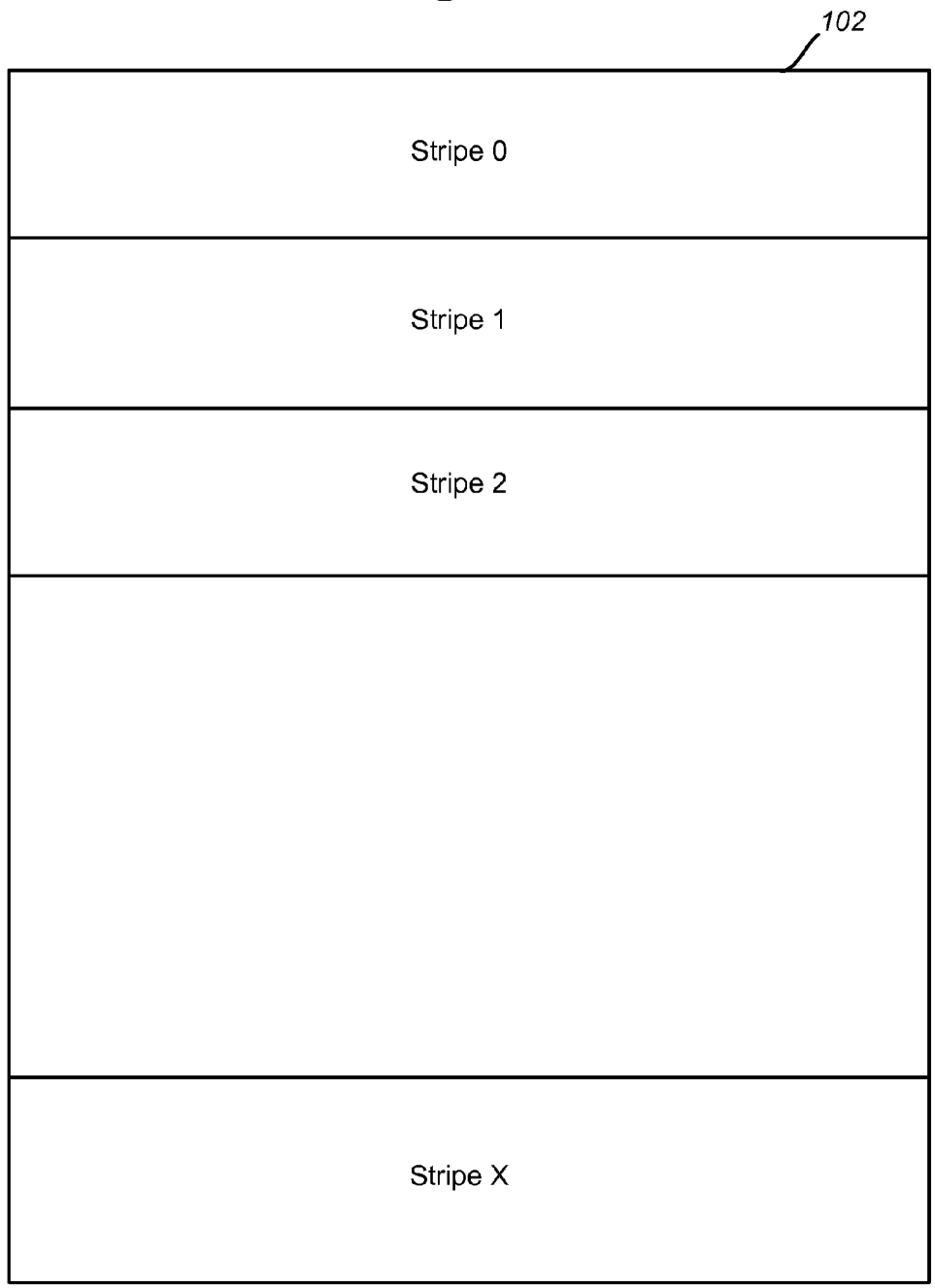

PRECHARGE PHASE

SENSE PHASE

CORRECTION PHASE

COMPARISON PHASE

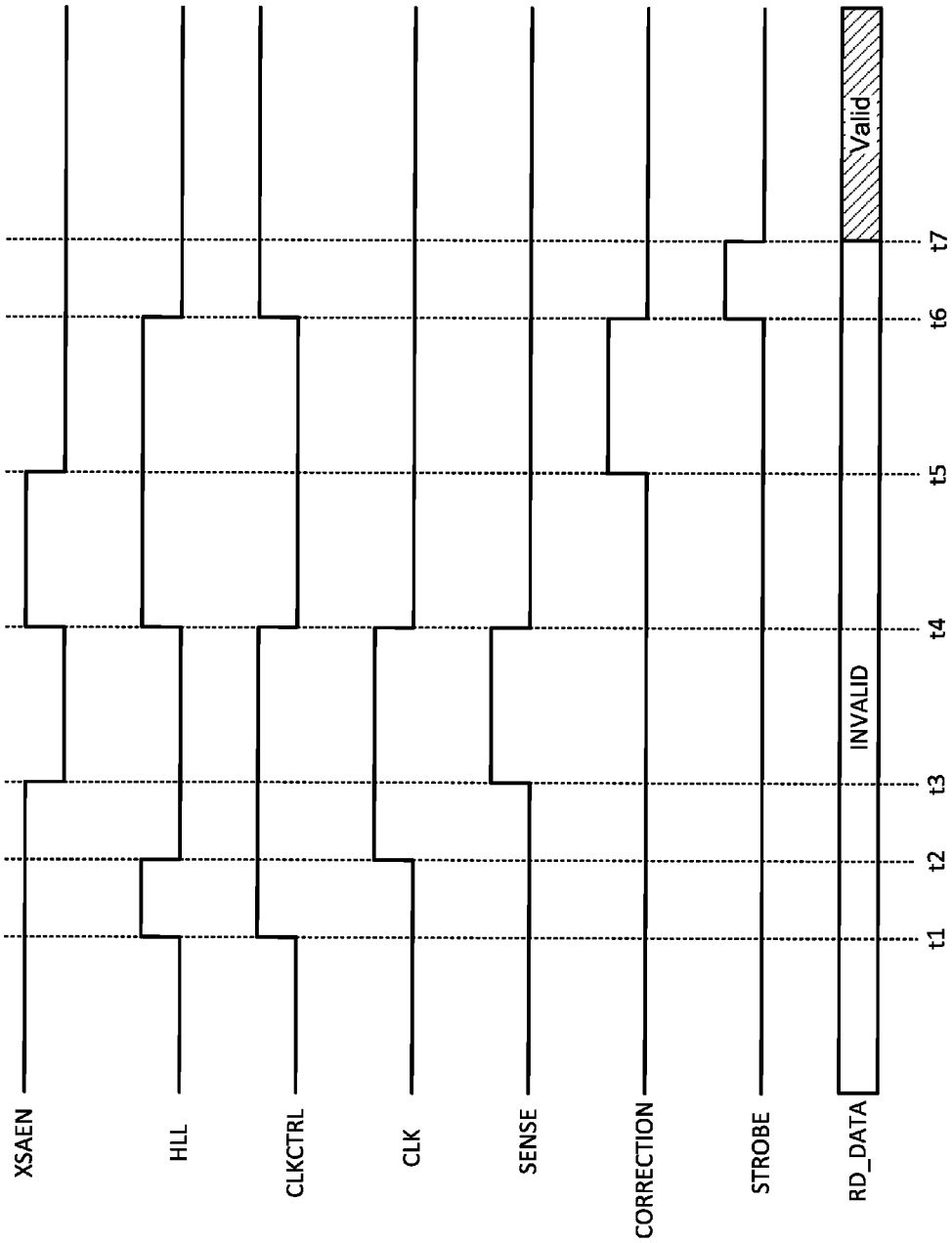

LEAKAGE CURRENT COMPENSATION WITH REFERENCE BIT LINE SENSING IN NON-VOLATILE MEMORY

BACKGROUND OF THE INVENTION

The present disclosure relates to technology for non-volatile storage.

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, it is desirable to minimize the amount of power used by the semiconductor memory in order to conserve the battery of the host electronic device. Additionally, consumers generally want the semiconductor memory to perform at sufficient speeds so that the memory does not slow down operation of the host electronic device.

BRIEF DESCRIPTION OF THE DRAWINGS

FIG. 8 depicts one example of an organization of a memory array.

FIG. 24 is a timing diagram depicting a set of control signals and voltage supplies for a sense amplifier during a read operation in accordance with one embodiment.

DETAILED DESCRIPTION

The disclosed technology is directed to a non-volatile memory including a sense amplifier that uses a reference bit line for accurate sensing. The sense amplifier includes a first capacitor coupled to a selected bit line and a second capacitor coupled to a reference bit line. The reference capacitor compensates for displacement currents in the selected bit line during sensing. Both plates of the capacitors are utilized to cancel the effects of leakage current that result from unselected memory cells in the selected memory array. During a precharge phase, the top plates of the capacitors are precharged. During a sense phase, the top plates of the capacitors are discharged. The selected bit line capacitor is discharged based on the selected cell current and the leakage current. The reference bit line capacitor is discharged based on a reference current in the reference bit line. The amount of discharge is transferred to the bottom plate of each capacitor, followed by a correction phase to discharge the bottom plates. The capacitor for the selected bit line is discharged based on the leakage current. In this manner, the correction phase facilitates a compensation based on the leakage current so that a sense amplifier voltage based on the selected cell current alone can be compared with a reference voltage.

The voltage at the top plate of the selected bit line capacitor and the voltage at the top plate of the reference bit line capacitor are provided to the two inputs of an operational amplifier. Both voltages contain voltage components resulting from displacement currents in the bit lines during sensing and the correction phases. Because the displacement currents are the same or substantially the same in both bit lines, these voltage components voltages are cancelled so that a comparison based on the selected cell current and a reference current can be made.

In one embodiment, a reverse read operation is performed by connecting a selected bit line to zero volts and a selected word line to a read voltage. The unselected word lines and unselected word lines are held at zero volts. Using these bias conditions enables a quick precharge and allows a low or zero bit line settling time to be used. The selected bit line develops a final sense amplifier voltage that includes the effects of displacement currents resulting from a short precharge time. The reference bit line develops a final sense amplifier voltage that includes the effects of the same or substantially the same displacement currents. These final sense amplifier voltages can be compared. Because they both contain the effects of the displacement currents, the components in each voltage resulting from the displacement currents are cancelled so that an accurate sensing of the on-cell current can be obtained and compared with a reference current.

Figure 1:
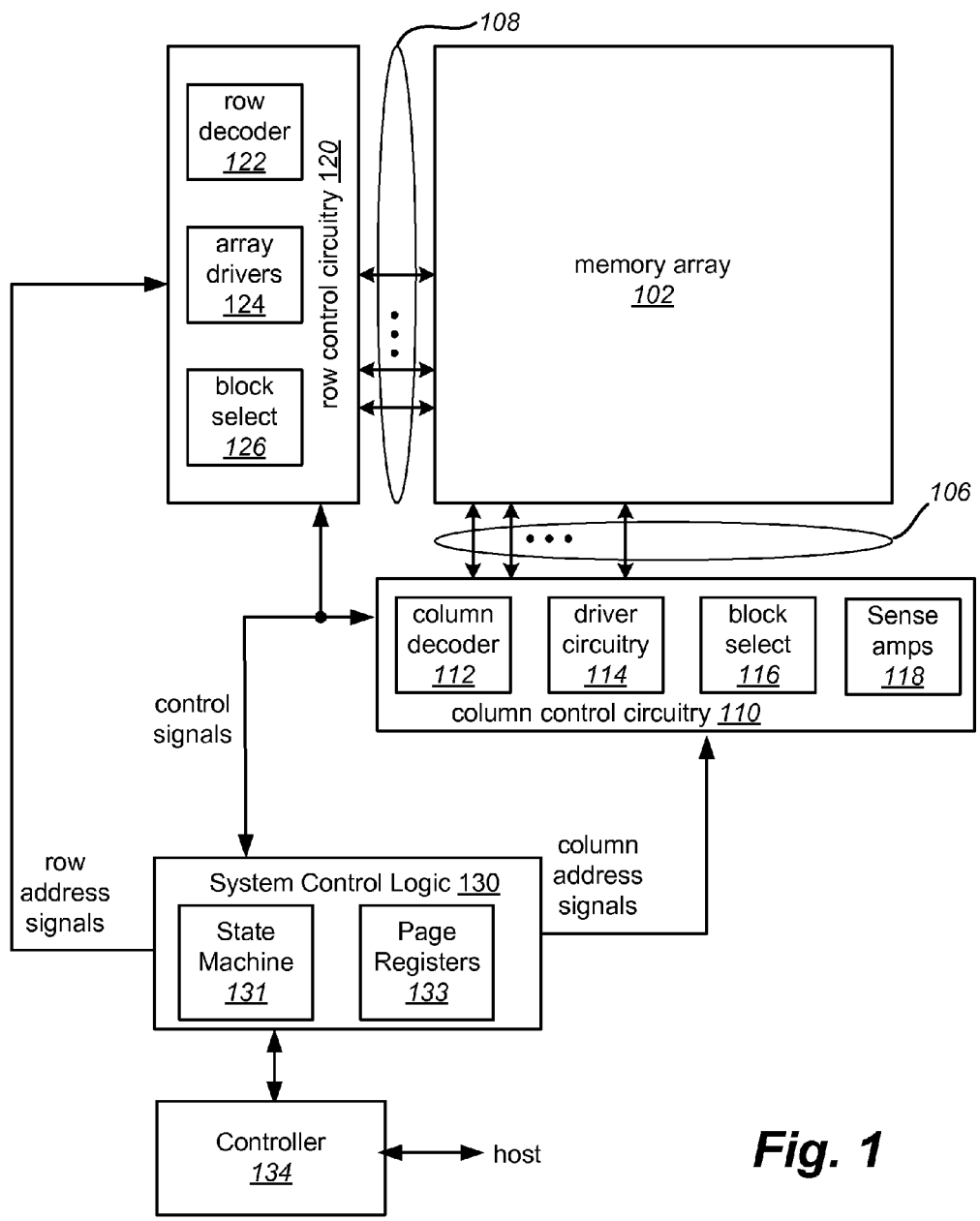
FIG. 1 is a block diagram of one embodiment of a non-volatile memory system.

FIG. 1 is a block diagram that depicts one example of a memory system 100 that can be used to implement embodiments of the disclosed technology. Memory system 100 includes a memory array 102, which can be a two or three-dimensional array of memory cells. In one embodiment, memory array 102 is a monolithic three dimensional memory array. The array terminal lines of memory array 102 include the various layer(s) of word lines organized as rows, and the various layer(s) of bit lines organized as columns. However, other orientations can also be implemented.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories are constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Memory system 100 includes row control circuitry 120, whose outputs 108 are connected to respective word lines of the memory array 102. For purposes of this document, a connection can be a direct connection or indirect connection (e.g., via one or more other components). Row control circuitry 120 receives a group of row address signals and one or more various control signals from System Control Logic circuit 130, and typically may include such circuits as row decoders 122, array drivers 124, and block select circuitry 126 for both read and programming operations.

Memory system 100 also includes column control circuitry 110 whose input/outputs 106 are connected to respective bit lines of the memory array 102. Column control circuitry 110 receives a group of column address signals and one or more various control signals from System Control Logic 130, and typically may include such circuits as column decoders 112, driver circuitry 114, block select circuitry 116, and sense amplifiers 118. In one embodiment, sense amplifiers 118 provide signals to the bit lines and sense signals on the bit lines. Various sense amplifiers known in the art can be used.

System control logic 130 receives data and commands from controller 134 and provides output data to controller 134. Controller 134 communicates with a host. System control logic 130 may include one or more state machines 131, page registers 133 and other control logic for controlling the operation of memory system 100. In other embodiments, system control logic 130 receives data and commands directly from a host and provides output data to that host, because system control logic 130 includes the functionality of a controller.

In one embodiment, system control logic 130, column control circuitry 110, row control circuitry 120 and memory array 102 are formed on the same integrated circuit. For example, system control logic 130, column control circuitry 110 and row control circuitry 120 can be formed on the surface of a substrate and memory array 102 is a monolithic three-dimensional memory array formed above the substrate (and, therefore, above all or a portion of system control logic 130, column control circuitry 110 and row control circuitry 120). In some cases, a portion of the control circuitry can be formed on the same layers as some of the memory array. Controller 134 can be on the same substrate as or a different substrate than the other components depicted in FIG. 1. Controller 134, system control logic 130, column control circuitry 110, column decoder 112, driver circuitry 114, block select 116, sense amplifiers 118, row control circuitry 120, row decoder 122, array drivers 124 and/or block select 126, alone or in any combination, can be considered control circuitry or one or more control circuits.

Memory array 102 includes a plurality of memory cells. In one embodiment, each memory cell includes a steering element (e.g., a diode) and a resistance element. In one example implementation, the memory cells may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer.

In another embodiment, memory cells are re-writable. For example, a rewriteable non-volatile memory cell can include a diode or other select device coupled in series or another fashion with a reversible resistance-switching element. A reversible resistance-switching element includes reversible resistance-switching material having a resistance that may be reversibly switched between two or more states. For example, the reversible resistance-switching material may be in an initial high-resistance state upon fabrication that is switchable to a low-resistance state upon application of a first voltage and/or current. Application of a second voltage and/or current may return the reversible resistance-switching material to the high-resistance state. Alternatively, the reversible resistance-switching element may be in an initial low-resistance state upon fabrication that is reversibly switchable to a high-resistance state upon application of the appropriate voltage(s) and/or current(s). One resistance state may represent a binary "0" while another resistance state may represent a binary "1." More than two data/resistance states may be used so that the memory cell stores two or more bits of data. In one embodiment, the process of switching the resistance from the high-resistance state to the low-resistance state is referred to as a SET operation. The process of switching the resistance from the low-resistance state to the high-resistance state is referred to as a RESET operation. The high-resistance state is associated with binary data "0" and the low-resistance state is associated with binary data "1." In other embodiments, SET and RESET and/or the data encoding can be reversed. In some embodiments, the first time a resistance-switching element is SET requires a higher than normal voltage and is referred to as a FORMING operation.

Figure 2:
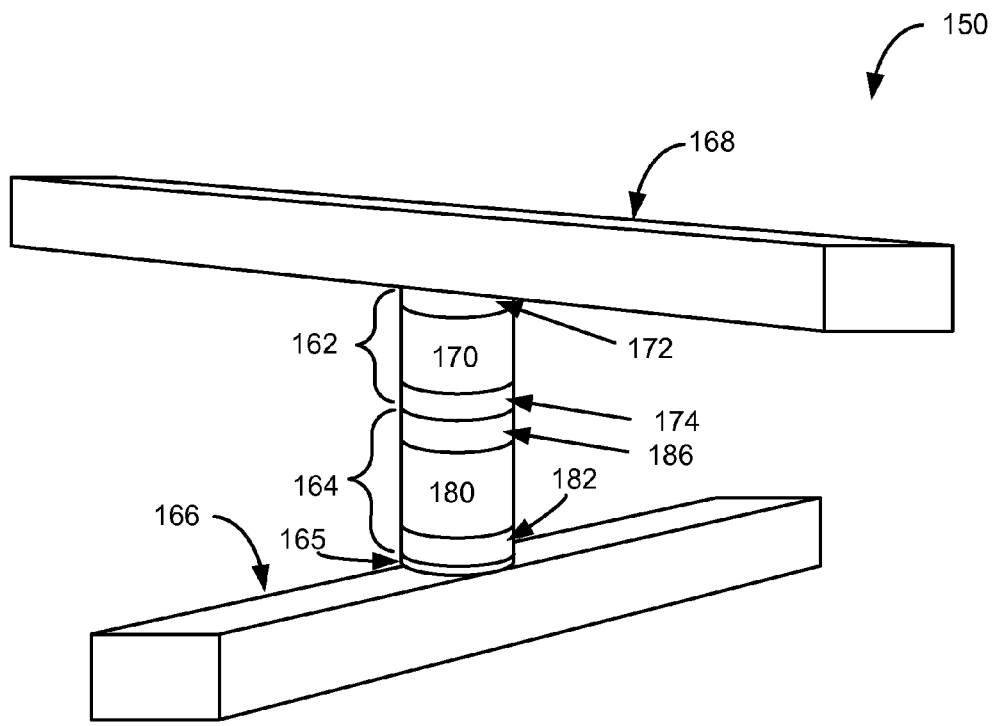
FIG. 2 is a simplified perspective view of one embodiment of a memory cell.

FIG. 2 is a simplified perspective view of one example of a memory cell 150 that includes reversible resistance-switching element 162, steering element 164 and barrier 165 coupled in series and positioned between a first conductor 166 and a second conductor 168. Reversible resistance-switching element 162 includes reversible resistance-switching material 170 having a resistance that may be reversibly switched between two or more states. In some embodiments, reversible resistance-switching material 170 may be formed from a metal oxide.

Various different metal oxides can be used. In one example, nickel oxide is used. In one embodiment, the reversible resistance-switching material 170 includes at least a portion of a nickel oxide layer formed by selectively depositing nickel and then oxidizing the nickel layer. In other embodiments, nickel oxide itself may be selectively deposited. In other embodiments Hafnium oxide may be deposited by an atomic layer deposition process using a precursor containing Hafnium. Other materials may be selectively deposited, and then annealed and/or oxidized if necessary, to form reversible resistance-switching materials for use in memory cells. For example, a layer of Nb, Ta, V, Al, Ti, Co, cobalt-nickel alloy, etc., may be selectively deposited, such as by electroplating, and oxidized to form a reversible resistance-switching material.

Another variable resistance material is amorphous silicon doped with V, Co, Ni, Pd, Fe or Mn, for example as described in Rose et al., U.S. Pat. No. 5,541,869. Another class of material is taught by Ignatiev et al. in U.S. Pat. No. 6,473,332: these are perovskite materials such as $Pr_1$—$XCa_xMnO_3$ (PCMO), $La_1$—$XCa_xMnO_3$ (LCMO), $LaSrMnO_3$ (LSMO), or $GdBaCo_xO_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716. Another example is to use carbon nanotubes as a reversible resistance-switching materials.

Another material is taught by Campbell et al. in U.S. Patent Application 2003/0045054, and by Campbell in U.S. Patent Application 2003/0047765. This material is doped chalcogenide glass of the formula $A_xB_y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni.

Reversible resistance-switching element 162 includes electrodes 172 and 174. Electrode 172 is positioned between reversible resistance-switching material 170 and conductor 168. In one embodiment, electrode 172 is made of platinum. Electrode 174 is positioned between reversible resistance-switching material 170 and steering element 164. In one embodiment, electrode 174 is made of Titanium Nitride, and serves as a barrier layer. In another embodiment electrode 174 is n+ doped polysilicon, resistance switching material 170 is Hafnium Oxide and electrode 172 is Titanium Nitride.

Steering element 164 can be a diode, or other suitable steering element that exhibits non-ohmic conduction by selectively limiting the voltage across and/or the current flow through the reversible resistance-switching element 162. In this manner, the memory cell 150 may be used as part of a two or three dimensional memory array and data may be written to and/or read from the memory cell 150 without affecting the state of other memory cells in the array. Steering element 164 may include any suitable diode such as a vertical polycrystalline p-n or p-i-n diode, whether upward pointing with an n-region above a p-region of the diode or downward pointing with a p-region above an n-region of the diode.

In some embodiments, steering element 164 may be a diode formed from a polycrystalline semiconductor material such as polysilicon, a polycrystalline silicon-germanium alloy, polygermanium or any other suitable material. For example, the steering element 164 can be a diode that includes a heavily doped n+ polysilicon region 182, a lightly doped or an intrinsic (unintentionally doped) polysilicon region 180 above the n+ polysilicon region 182, and a heavily doped p+ polysilicon region 186 above the intrinsic region 180. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 182 to prevent and/or reduce dopant migration from the n+ polysilicon region 182 into the intrinsic region 180. It will be understood that the locations of the n+ and p+ regions may be reversed. When steering element 164 is fabricated from deposited silicon (e.g., amorphous or polycrystalline), one embodiment may include a silicide layer being formed on the diode to place the deposited silicon in a low resistance state.

Conductors 166 and 168 include any suitable conductive material such as tungsten, any appropriate metal, heavily doped semiconductor material, a conductive silicide, a conductive silicide-germanide, a conductive germanide, or the like. In the embodiment of FIG. 2, conductors 166 and 168 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 166 and 168 to improve device performance and/or aid in device fabrication. In one embodiment, conductors 166 and 168 can be bit lines or word lines.

Although the reversible resistance-switching element 162 is shown as being positioned above the steering element 164 in FIG. 2, it will be understood that in alternative embodiments, the reversible resistance-switching element 162 may be positioned below the steering element 164. While FIG. 2 shows one example of a memory cell, no one particular type or structure of a memory cell is required for the technology disclosed herein. Many different types of memory cells can be used.

Figure 3:
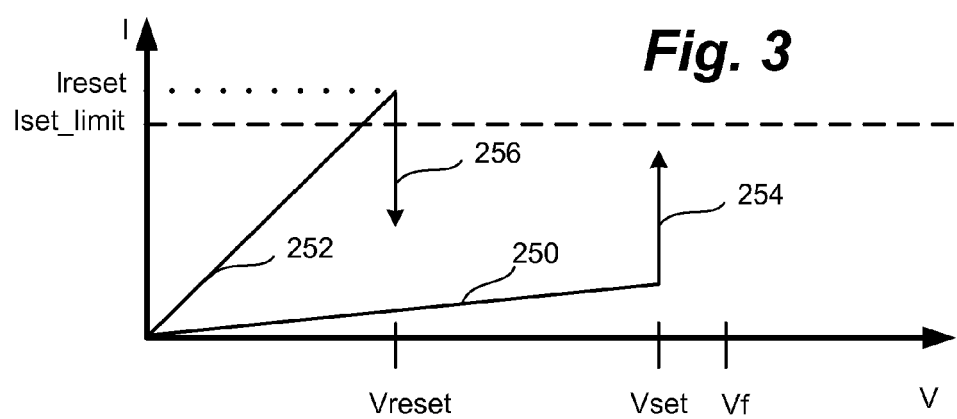
FIG. 3 is a graph depicting I-V characteristics of a reversible resistance-switching element.

FIG. 3 is a graph of voltage versus current for one example embodiment of a metal oxide reversible resistance-switching element. Line 250 represents the I-V characteristics of the reversible resistance-switching element when in the high-resistance state. Line 252 represents the I-V characteristics of the reversible resistance-switching element when in the low-resistance state. To determine which state the reversible resistance-switching element is in, a voltage is applied and the resulting current is measured. A higher measured current (see line 252) indicates that the reversible resistance-switching element is in the low-resistance state. A lower measured current (see line 250) indicates that the reversible resistance-switching element is in the high-resistance state. Note that other variations of a reversible resistance-switching element having different I-V characteristics can also be used with the technology herein.

While in the high-resistance state (see line 250), if the voltage Vset and sufficient current is applied to the memory cell, the reversible resistance-switching element will be SET to the low-resistance state. Line 254 shows the behavior when VSET is applied. The voltage will remain somewhat constant and the current will increase toward Iset_limit. At some point, the reversible resistance-switching element will be SET and the device behavior will be based on line 252. Note that the first time the reversible resistance-switching element is SET, Vf (the forming voltage) is needed to SET the device. After that, VSET can be used. The forming voltage Vf may be greater than VSET.

While in the low-resistance state (see line 252), if the voltage VRESET and sufficient current (Ireset) is applied to the memory cell, the reversible resistance-switching element will be RESET to the high-resistance state. Line 256 shows the behavior when VRESET is applied. At some point, the reversible resistance-switching element will be RESET and the device behavior will be based on line 250.

In one embodiment, Vset is approximately 5 volts, Vreset is approximately 3 volts, Iset_limit is approximately 5 uA and the Ireset current could be as high as 30 uA. In some embodiments, Vset can be lower than Vreset, the forming operation is not needed and/or the time needed to SET or RESET could be different.

The programming operations to SET and RESET the resistance of reversible resistance-switching material are known in the art. Many different implementations of circuits to SET and RESET the resistance of reversible resistance-switching material are known and can be used with the technology described herein.

In some implementations, the SET operation can be followed by a verify operation to see if the SET operation was successful. If not, the SET operation can be retried. In one example implementation, the verify operation is a read operation. Therefore, system control logic 130 will first cause one or more memory cells to be programmed (SET or RESET) and will then read all of the memory cells programmed. If the data read matches the data to be programmed, then the process is complete. If some of the data read does not match the data programmed (most likely because the programming was not successful), then the programming is repeated.

Figure 4A:
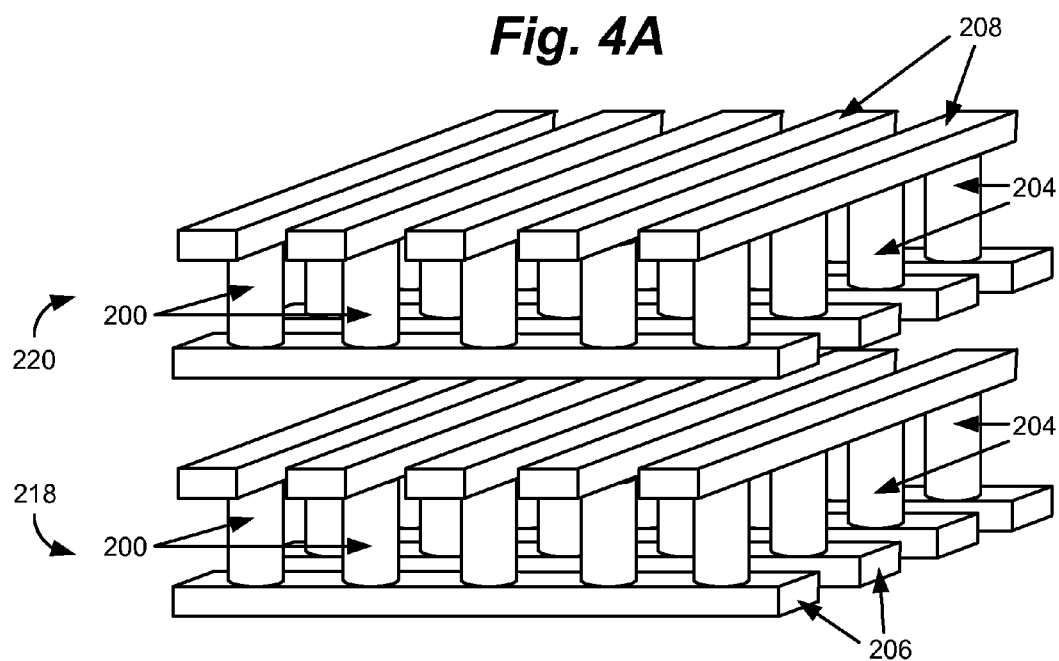
FIG. 4A is a simplified perspective view of a portion of one embodiment of a three-dimensional memory array.

Memory array 102 comprises many memory cells. FIG. 4A is a simplified perspective view of a portion of a monolithic three dimensional array 102 that includes a first memory level 218 positioned below a second memory level 220. In the embodiment of FIG. 4A, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4A for simplicity. Other memory array configurations may be used, as may additional levels of memory. In the embodiment of FIG. 4A, all diodes may "point" in the same direction, such as upward or downward depending on whether p-i-n diodes having a p-doped region on the bottom or top of the diode are employed, simplifying diode fabrication. Memory cells 200 can be the same as or different than memory cell 150.

Figure 4B:
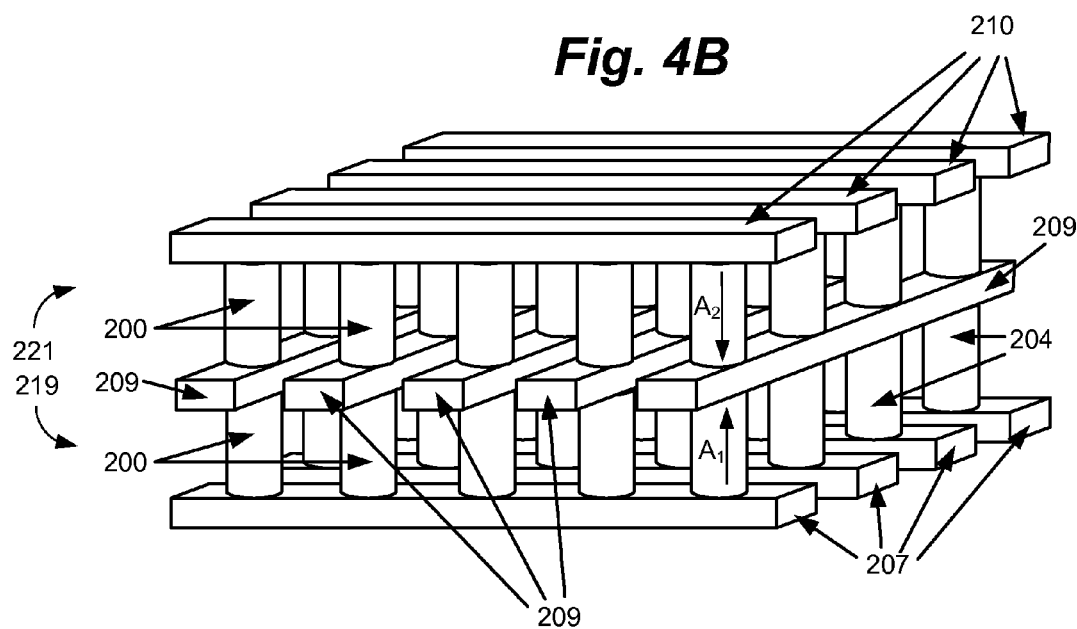
FIG. 4B is a simplified perspective view of a portion of one embodiment of a three-dimensional memory array.

FIG. 4B is a simplified perspective view of a portion of a second embodiment of a monolithic three-dimensional array 102 that includes a first memory level 219 positioned below a second memory level 221. The memory array of FIG. 4B includes a plurality of memory cells 200. With respect to first memory level 219, memory cells 200 are between and connect to a set of bit lines 207 and a set of word lines 209. With respect to second memory level 221, memory cells 200 are between and connect to a set of bit lines 210 and word lines 209. The upper conductors of a first memory level may be used as the lower conductors of a second memory level that is positioned above the first memory level, as shown in FIG. 4B.

In the embodiment of FIG. 4B, the diodes (or other steering devices) on adjacent memory levels point in opposite directions in one example. For example, the diodes of the first memory level 219 may be upward pointing diodes as indicated by arrow $A_1$ (e.g., with p regions at the bottom of the diodes), while the diodes of the second memory level 221 may be downward pointing diodes as indicated by arrow $A_2$ (e.g., with n regions at the bottom of the diodes), or vice versa.

Figure 5:
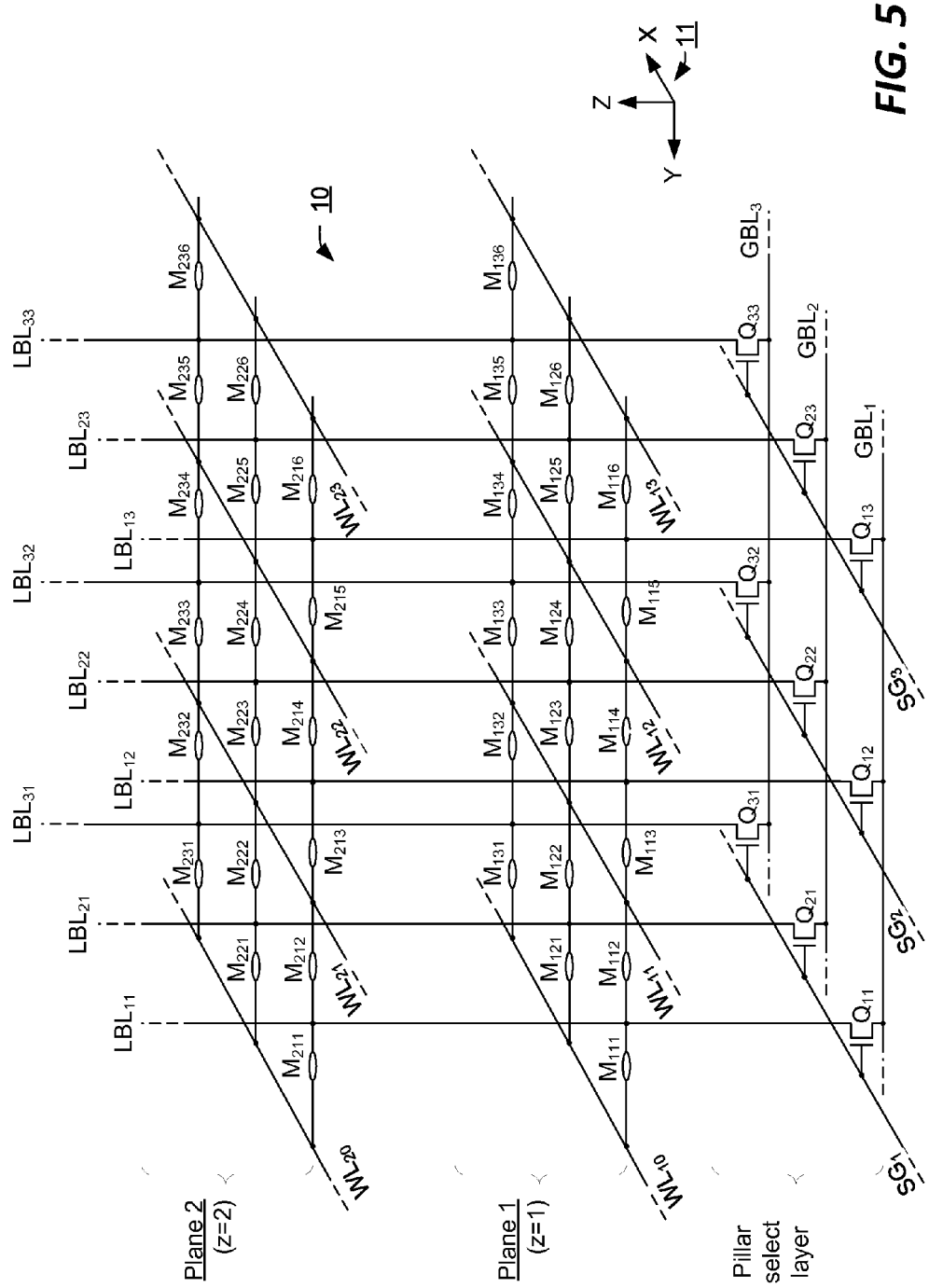
FIG. 5 is an equivalent circuit for a portion of an example three-dimensional array of variable resistance memory elements including a vertical bit line architecture with vertical TFT select devices.

FIG. 5 depicts an architecture of a three-dimensional memory 10 described using a schematic of an equivalent circuit of a portion of the 3D memory. A standard three-dimensional rectangular coordinate system 11 is used for reference, the directions of each of vectors x, y and z being orthogonal with the other two. In another embodiment direction x and y are substantially 60 degrees from each other. Other degrees of intersection may be used. The array in FIG. 5 includes vertical bit lines.

A circuit for selectively connecting internal memory elements with external data circuits is formed using select devices $Q_{xy}$, where x gives a relative position of the device in the x-direction and y its relative position in the y-direction. The individual select devices $Q_{xy}$ are vertical TFTs in accordance with embodiments. Global bit lines ($GBL_x$) are elongated in the y-direction and have relative positions in the x-direction that are indicated by the subscript. The global bit lines ($GBL_x$) are individually connectable with the source or drain of the vertical TFT select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of vertical TFT select devices $Q_{xy}$ having a common position in the y-direction. The vertical TFT select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the vertical TFT select devices to which it is connected. The remaining row select lines receive voltages that keep their connected vertical TFT select devices $Q_{xy}$ off. It may be noted that since only one vertical TFT select device ($Q_{xy}$) is used with each of the local bit lines ($LBL_{xy}$), the pitch of the array across the semiconductor substrate in both x and y-directions may be made very small, and thus the density of the memory storage elements large.

Memory elements $M_{zxy}$ are formed in a plurality of planes positioned at different distances in the z-direction above a substrate (which may be below the pillar select layer). Two planes 1 and 2 are illustrated in FIG. 1 but there will typically be additional planes such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. After the device is first fabricated, voltages may be selected to provide the electrical stimulus necessary to "form" the memory element, which refers to lowering its resistance from a virgin state. The levels, duration and other characteristics of these voltages depend upon the material that is used for the memory elements.

Each "plane" of the three-dimensional memory structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other above a semiconductor substrate with the local bit lines $LBL_{xy}$ being connected with storage elements $M_{zxy}$ of each plane through which the local bit lines extend.

Figure 6:
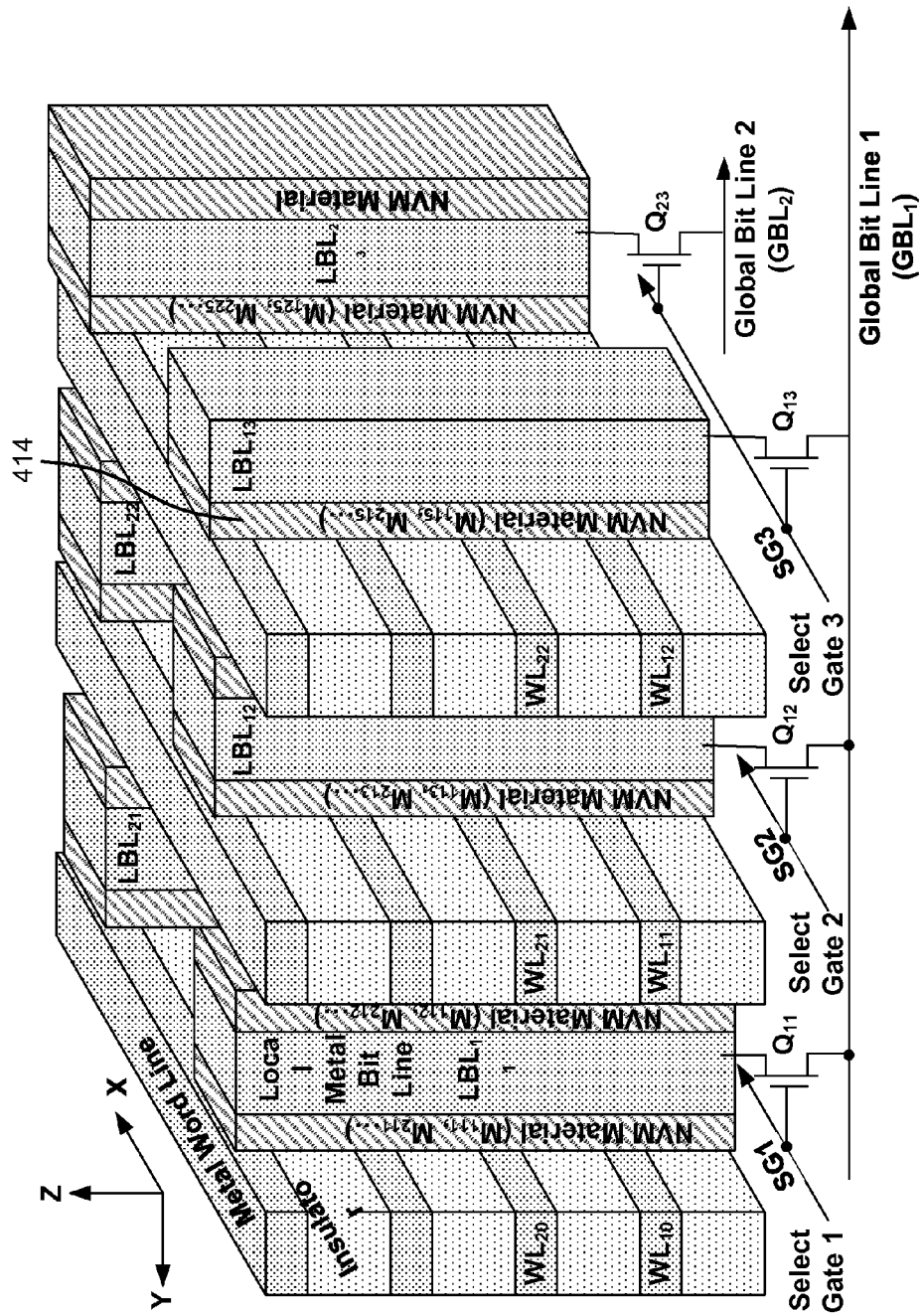
FIG. 6 is an isometric view of a portion of the three-dimensional array shown in FIG. 9 according to a one example.

FIG. 6 depicts one embodiment of a portion of a monolithic three-dimensional memory array that includes vertical strips of a non-volatile memory material. The physical structure depicted in FIG. 6 may include one implementation for a portion of the monolithic three-dimensional memory array depicted in FIG. 5. The vertical strips of non-volatile memory material may be formed in a direction that is perpendicular to a substrate (e.g., in the Z direction).

A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may include a single continuous layer of material that may be used by a plurality of memory cells or devices.

In one example, portions of the vertical strip of the non-volatile memory material 414 may include a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may include a MOS device (e.g., an NMOS device) or a vertical TFT.

Figure 7A:
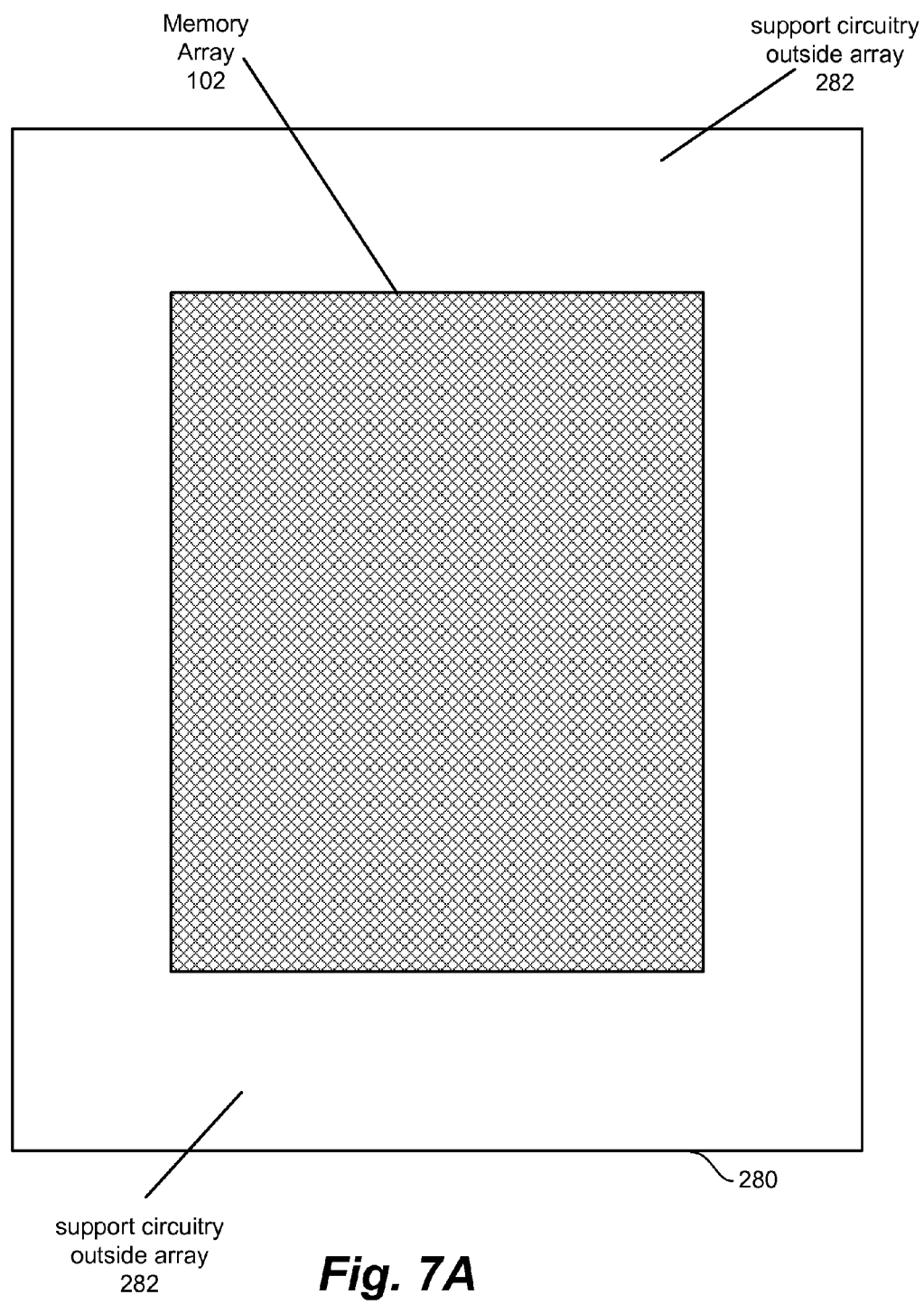
FIG. 7A depicts a top view of a memory system.

In one embodiment of a monolithic three-dimensional memory array, the bit lines are arranged in a first direction and the word lines are arranged in a second direction perpendicular to the bit lines. In a monolithic three-dimensional memory array with additional layers of memory cells, there are additional layers of bit lines and word lines. The supporting circuitry (e.g., column control circuitry 110, row control circuitry 120, and system control logic 130) are arranged on the surface of the substrate with the memory array fabricated above all or a portion of the supporting circuitry. For Example, FIG. 7A shows a top view of memory array 102 positioned over substrate 280. Support circuitry 282 is positioned on the surface of substrate 280. Memory array 102 is positioned above support circuitry 282. Some of the support circuitry 282 is below memory array 102. Some of the support circuitry 282 is outside of memory array 102. By "outside of the memory array" it is meant that the memory array is not positioned over the circuitry that is outside of the memory array.

Figure 7B:
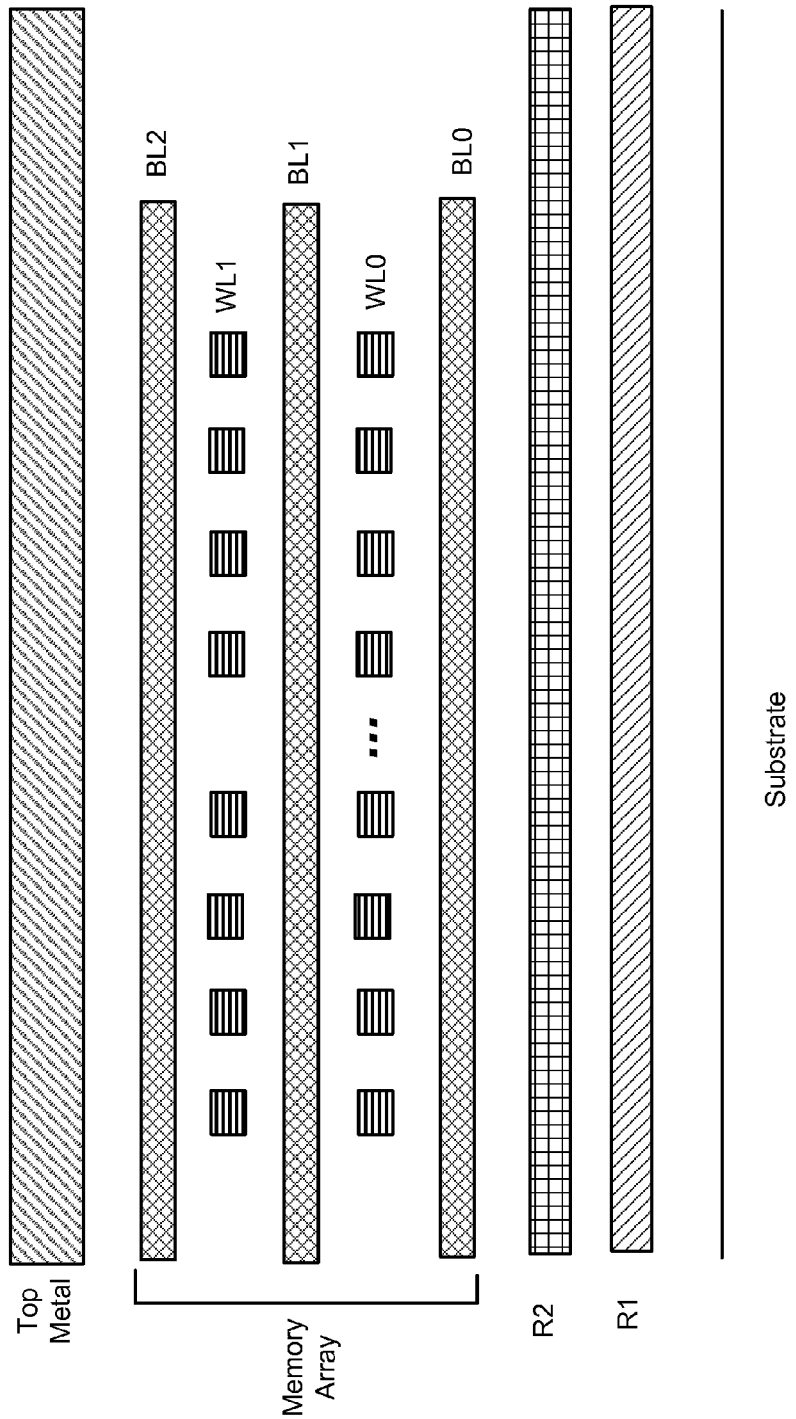
FIG. 7B depicts a subset of the layers of one embodiment of a three-dimensional memory.

FIG. 7B, which depicts various layers of an integrated circuit, shows the Memory Array positioned above the Substrate. The Memory Array includes bit line layers BL0, BL1 and BL2, and word line layers WL0 and WL1. In other embodiments, additional bit line and word line layers can also be implemented. An integrated circuit implementing a semiconductor memory system also includes multiple metal layers used for routing signals between different components of the support circuitry, and between the supporting circuitry and the bit lines and word lines. These metal layers are arranged above the support circuitry that is implemented on the surface of the Substrate and below the Memory Array. FIG. 7B shows two metal layers R1 and R2 used for routing; however, other embodiments can include more or less than two metal layers. In one example, these metal layers R1 and R2 are formed of Tungsten (about 1.5 ohm/square), which has both a relatively high resistance and high capacitance.

Positioned above the memory array can be one or more metal layers used for routing signals between different components of the memory system. FIG. 7B shows one such metal layer above the memory array, labeled as the Top Metal layer. In one example, the top metal layer is formed of aluminum or copper (about 0.05 ohm/square), which has a smaller resistance and capacitance than layers R1 and R2. Metals layers R1 and R2 are not implemented using the same materials as used for the Top Metal because the metal used for R1 and R2 needs to withstand the processing steps for fabricating the memory array on top of R1 and R2.

Vias can be added to make connections between adjacent metal layers. Zias can be added to make connections between layers that are not adjacent. A zia is a multi-layer via and can connect more than 2 layers (in which case the zia looks like a staircase).

Memory array 102 is subdivided into stripes in one example, as depicted in FIG. 8. Each stripe is divided into blocks and blocks are grouped into bays. In one embodiment, each block includes two stripes. In other embodiments, one bay can be implemented in one stripe or a portion of one stripe. In some implementations, a bay can be implemented across all or portions of two or more stripes. Each bay includes multiple blocks. The number of blocks in a bay can vary.

Figure 9:
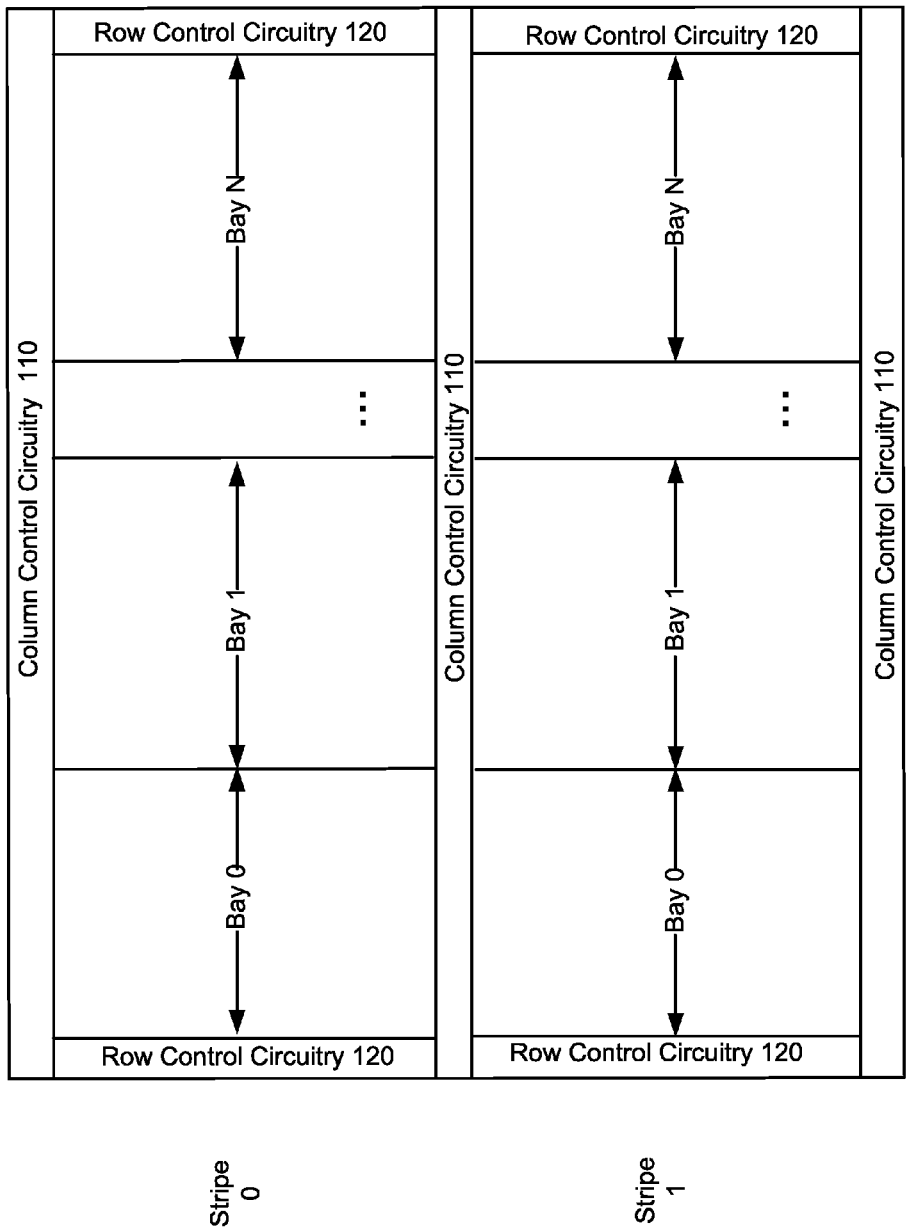
FIG. 9 depicts one embodiment of the structure of two stripes of a memory array.

FIG. 9 shows one example implementation of two stripes (Stripe 0 and Stripe 1), where each bay (Bay 0, Bay 1, . . . , Bay N) is implemented across a portion of two neighboring stripes. For example, Bay 0 is partially in Stripe 0 and partially in Stripe 1. Therefore, in the example of FIG. 9, a bay includes memory cells in two stripes. The number of bays in a stripe can vary. FIG. 9 shows Column Control Circuitry 110 on opposite sides of a stripe (e.g., top and bottom) and Row Control Circuitry on different opposite sides of a stripe (e.g., left and right).

Figure 10:
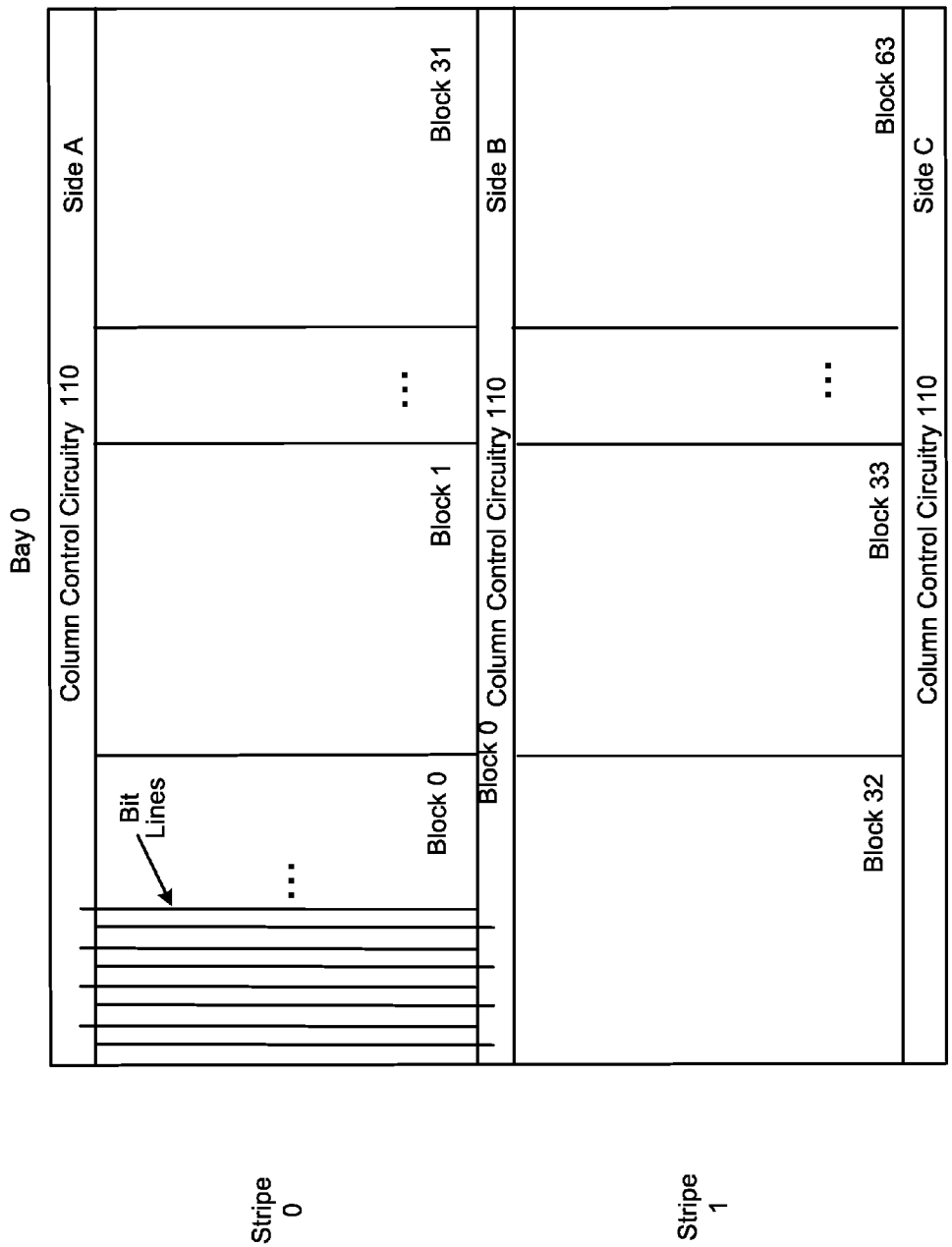
FIG. 10 depicts one embodiment of a bay.

FIG. 10 provides more details of one example of a bay (e.g., Bay 0), that is implemented across two stripes (e.g., stripe 0 and stripe 1). In one embodiment, a bay has sixty four blocks with Block 0, Block 1, . . . , Block 31 in Stripe 0 and Block 32, Block 33, . . . , Block 63 in Stripe 1. However, other embodiments can implement a different number of blocks.

A block is a contiguous group of memory cells having contiguous word lines and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. An integrated circuit may include one or more than one memory array.

FIG. 10 shows a subset of the Bit Lines for Block 0. The substrate is wider than the memory array; therefore, portions of the Column Control Circuitry 110 can protrude out from under the memory array to facilitate connections using zias and vias to R1, R2, Top Metal, and the bit lines, while other portions of Column Control Circuitry 110 can be positioned under the memory array. Column Control Circuitry 110 (including decoders and sense amplifiers) is divided into two sets of circuits, with each set of circuits being located on opposite sides (e.g. Side A and Side B) of the integrated circuit so that one set of circuits of Column Control Circuitry 110 protrudes out from a first side (Side A) of the memory array and the second set of circuits of Column Control Circuitry 110 protrudes out from the opposite side (Side B) of the memory array. Half of the bit lines for a block are connected to one set of circuits of Column Control Circuitry 110 on side A and the other half of the bit lines for a block are connected to the second set of circuits of Column Control Circuitry 110 on side B. In one embodiment, these two sets of bit lines are interleaved so that every other bit line connects to Column Control Circuitry 110 on side A and the intervening bit lines connect to Column Control Circuitry 110 on side B. There could be cases in which two neighboring bit lines are picked from side A and the next 2 from side B. This depends on process. Other blocks in the bay are similarly arranged (e.g., sides B and C, etc.). In one embodiment, the bit lines are shared between upper and lower blocks. For example, even bit lines in Block 32 of Stripe 1 are shared with even bit lines in Block 0 of Stripe 0. Similarly, odd bit lines in Block 32 of Stripe 1 are shared with odd bit lines in Block 0 of Stripe 0. In this manner, column control circuitry 110 can decode and drive bit lines for its upper or bottom blocks.

In one embodiment, word lines (not depicted in FIG. 10) are shared by two adjacent blocks. For example, half of the word lines connected to Block 1 are also connected to Block 0 and the other half of the word lines connected to Block 1 are also connected to Block 2. In one example, every other word line connected to Block 1 is also connected to Block 0, with the intervening word lines also connected to Block 2. For embodiments with word lines shared by two adjacent blocks, the word line drivers are positioned on the substrate and between the two adjacent blocks. For example, a word line connected to Block 0 and Block 1 is driven by a word line driver positioned between Block 0 and Block 1. In this manner, a word line driver is in the middle of the memory cells it is driving. Such an arrangement reduces the resistance experienced by the signal driven by the word line driver and reduces the IR drop along the word line when concurrently programming multiple memory cells that are located on both sides of the driver.

In one embodiment, there are two sense amplifiers for each block located below the blocks, for example, on the surface of the substrate. One of the two sense amplifiers are for bit lines that connect to Column Control Circuitry 110 on side A and the other sense amplifier is for bit lines that connect to Column Control Circuitry 110 on side B. In one embodiment that includes 64 blocks in a bay, there are 64 sense amplifiers for a bay with 32 for side A and 32 for side B. In one embodiment, one property of a bay is that all of the blocks in the bay share the same 64 sense amplifiers. That means that 64 memory cells in a bay can be simultaneously selected for programming or reading. Thus, the memory system includes circuits for selecting the 64 memory cells and lines for routing signals between the 64 selected memory cells and the sense amplifiers. In some embodiments, less than 64 memory cells are selected for simultaneous programming in order to limit the power used at any given time.

To reduce resistance and capacitance in data lines between selected memory cells and the sense amplifiers, a sectional data line scheme can be used. Local data lines are provided for each section, where a section can include one, two, four, or another number of blocks. Selection circuits are used to connect the local data lines to the appropriate bit lines. Sense amplifier outputs are provided to global data lines across all blocks in the bay. Selection circuits are used to connect the global data lines to the appropriate local data lines.

Figure 11:
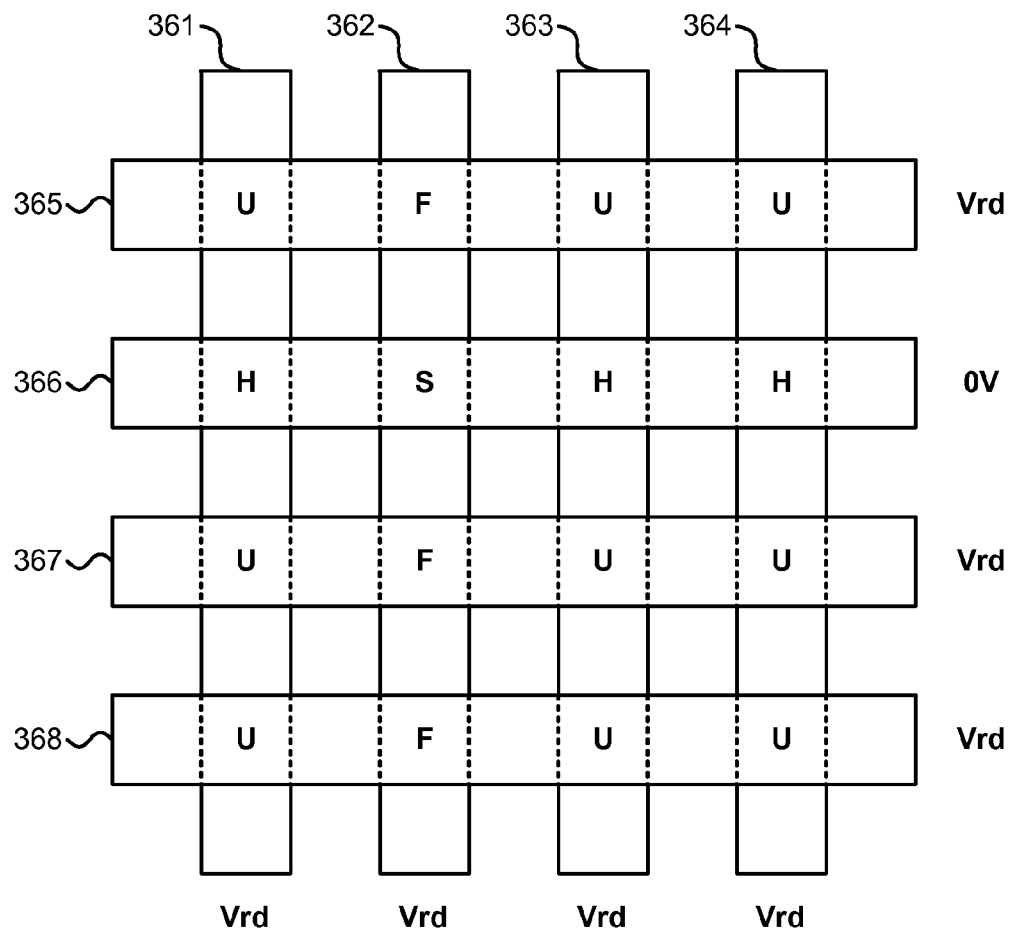
FIG. 11 depicts a portion of a memory array and bias conditions for a forward read operation.

FIG. 11 depicts a portion of a cross-point memory array. The memory array includes word lines 365-368 and bit lines 361-364. Word line 366 is a selected word line and bit line 362 is a selected bit line. At the intersection of selected word line 366 and selected bit line 362 is a selected memory cell (an S cell). The voltage across the S cell is the difference between the selected word line voltage and the selected bit line voltage.

Memory cells at the intersections of selected word line 366 and unselected bit lines 361, 363, and 364 include unselected memory cells (H cells). H cells are unselected memory cells that share a selected word line that is biased to the selected word line voltage. The voltage across H cells is the difference between the selected word line voltage and the unselected bit line voltage.

Memory cells at the intersections of selected bit line 362 and unselected word lines 365, 367, and 368 include unselected memory cells (F cells). F cells are unselected memory cells that share a selected bit line that is biased to a selected bit line voltage. The voltage across F cells is the difference between the unselected word line voltage and the selected bit line voltage.

Memory cells at the intersections of the unselected word lines 365, 367, and 368 and the unselected bit lines 361, 363, and 364 include unselected memory cells (U cells). The voltage across U cells is the difference between the unselected word line voltage and the unselected bit line voltage.

The number of F cells is related to the length of the bit lines (or the number of memory cells connected to a bit line), whereas the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

FIG. 11 depicts a set of bias conditions for performing a forward bias read operation. With the storage elements configured from the bit lines to the word lines, a positive bias may be created across a selected memory cell by applying a positive read voltage Vrd to the selected bit line while grounding or applying 0V to the selected word line. A memory cell in a low resistance state will cause a larger current flow from the sense amplifier to the selected bit line, through the selected memory cell, and to the selected word line. The unselected word lines and the unselected bit lines are biased at Vrd to turn off the unselected memory cells and inhibit a large current flow through them.

Figure 12:
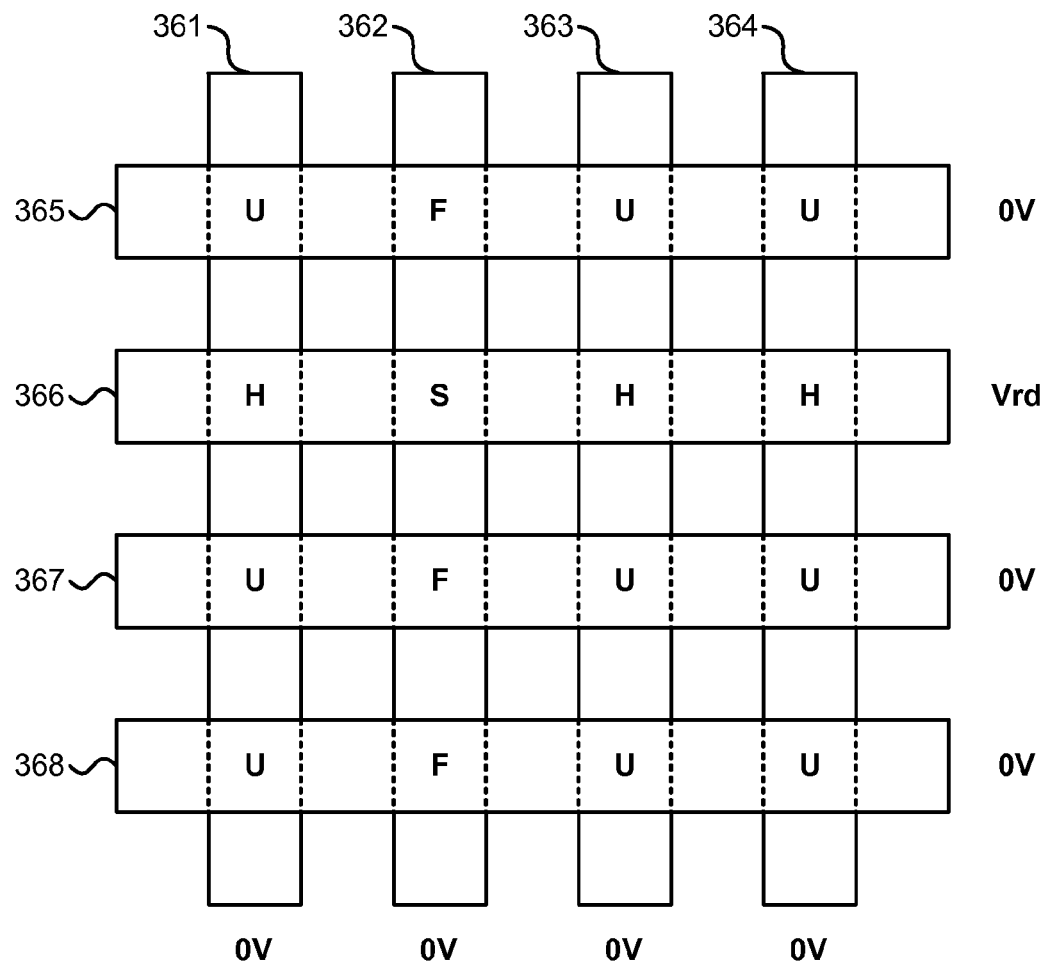
FIG. 12 depicts a portion of a memory array and bias conditions for a reverse read operation.

FIG. 12 depicts the memory array from FIG. 11 with a set of voltages for performing a reverse bias read operation. A reverse bias may be created across a selected memory cell by applying a positive read voltage Vrd to the selected word line while grounding or applying 0V to the selected bit line. A memory cell in a low resistance state will cause a larger current flow from the selected word line through the selected memory cell to the selected bit line and on to the sense amplifier. In a reverse bias read operation, the unselected word lines and the unselected bit lines are biased at 0V or ground to turn off the unselected memory cells and inhibit a large current flow through them. In a reverse read operation, the unselected bit lines and word lines can all be connected to ground directly. This can save voltage resources and reduce the settling time before sensing can be performed.

Figure 13A:
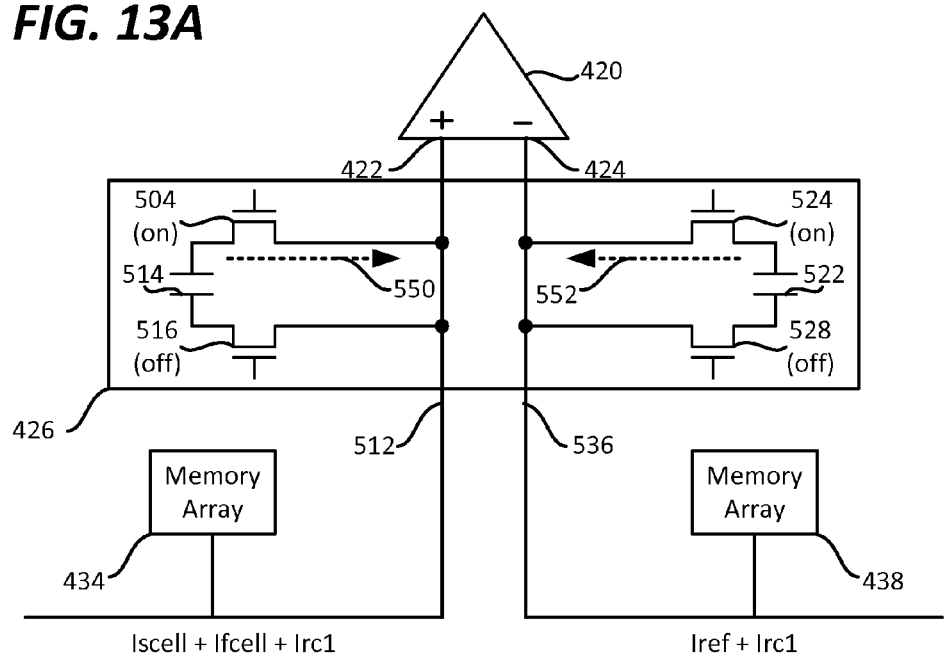
FIG. 13A is a block diagram depicting a sense amplifier in accordance with one embodiment during a sense phase.
Figure 13B:
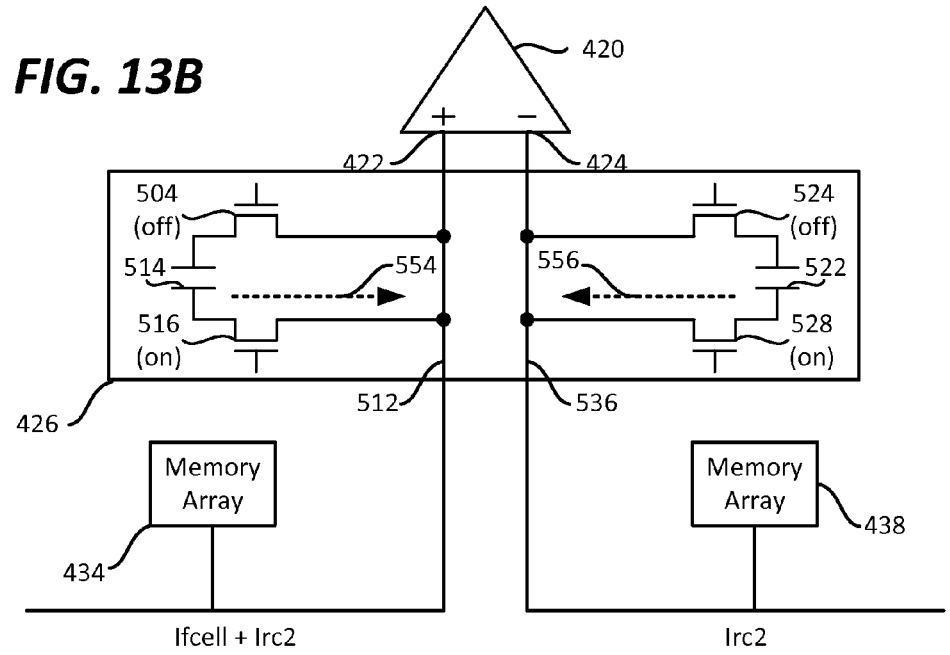
FIG. 13B is a block diagram depicting a sense amplifier in accordance with one embodiment during a correction phase.

FIGS. 13A and 13B are block diagrams including a sense amplifier in accordance with an embodiment of the disclosed technology. Sense amplifier 426 is one example of an implementation of a sense amp 118 as shown in FIG. 1. Sense amplifier 426 is coupled to a selected bit line 512 and a reference bit line 536. The selected bit line can be selectively coupled to a first memory array 434 and the reference bit line can be selectively coupled to a second memory array 438. The different memory arrays may be different memory arrays or different subarrays such as different bays or different blocks within a bay as depicted in FIGS. 9 and 10. term memory array is used interchangeably to refer to different memory arrays or memory subarrays.

The second memory array 438 is a reference memory array and the first memory array 434 is a selected memory array in the example. The reference memory array may be a dedicated memory array used for the reference purposes described herein or may be a main memory array that is disabled and used as a reference memory array during a read operation. In the latter example, the reference array may be dynamic, comprising different ones of the memory arrays within the device at different times. The memory arrays may include a memory array with bit lines arranged in a direction horizontal to the substrate, such as the memory arrays depicted in FIG. 4A and FIG. 4B. In another embodiment, the memory arrays may include a memory array with bit lines arranged in a vertical direction that is perpendicular to the substrate, such as the memory array depicted in FIGS. 5 and 6.

Sense amplifier 426 operates generally to facilitate reading from a selected memory array using a short precharge time. Typically, extended precharge periods are utilized to permit a selected bit line to become stable before sensing. An extended precharge period can be used to avoid displacement currents through parasitic capacitances, for example. However, the use of extended precharge times can increase read times, thus affecting the overall performance of a memory device. The utilization of a reference bit line as shown in FIGS. 13A and 13B allows shorter precharge times to be used. For example, sensing may begin before allowing the displacement current in the selected bit line to subside. The reference bit line can replicate the displacement current in the selected bit line. An operational amplifier such as an operational transconductance amplifier (OTA) receives a voltage from sensing based on the selected bit line 512 at a first input 422 and a voltage from sensing based on the reference bit line 536 at a second input 424. In this manner, the operational amplifier can compare at the inputs the sense voltage with a reference voltage, without the effects of the displacement current which is present in both bit lines and thus can be cancelled out in the comparison. Additionally, sense amplifier 426 is configured to perform a read operation using multiple phases so that the leakage current resulting from unselected cells can be removed to give an accurate sense result based only on the selected cell current.

FIG. 13A depicts a sense phase of a read operation using the sense amplifier 426. During the sense phase, the top plate of capacitor 514 is coupled to the selected bit line 512 by turning on transistor 504 and turning off transistor 516. With the memory array 434 biased for reading a selected memory cell at bit line 512, a current 550 is generated that discharges the top plate of capacitor 514. Current 550 includes the selected cell current Iscell as well as a current Ifcell resulting from leakage in the unselected cells of memory array 434 (e.g., those coupled to bit line 430) and a displacement current Irc1 present in the selected bit line 430 during sensing. Irc1 may result from utilizing a short precharge time as described above.

During the sense phase, the top plate of capacitor 522 is coupled to the reference bit line 512 by turning on transistor 524 and turning off transistor 528. A current 552 is generated in the reference bit line 536 that discharges the top plate of capacitor 524. Current 552 includes a reference current Iref that can be generated during the sense phase from a current source as later described. Current 552 also includes a displacement current Irc1 present in the reference bit line 536 during sensing. The displacement current Irc1 in the reference bit line is substantially equal to the displacement current Irc1 in the selected bit line. The reference bit line can be formed in a manner to have equal resistance and capacitance values so that the two values will be equal or substantially equal.

Looking at the current 550 and current 552, it can be see that they differ by the Iscell current and Ifcell current in the selected bit line and the Iref current in the reference bit line. Both currents include Irc1. The final sense voltages at capacitors 514 and 522 based on these currents can be compared by operational amplifier 420. The comparison will include a comparison of the voltage resulting from the Iscell and Ifcell current in the selected bit line and the voltage resulting from the Iref current in the reference bit line. By using the reference bit line, the effects of the displacement current Irc1 is removed from the comparison.

The disclosed sense amplifier additionally performs a correction phase as shown in FIG. 13B to remove the effects of the leakage current Ifcell. During the correction phase, the bottom plate of capacitor 514 is coupled to the selected bit line 512 by turning off transistor 504 and turning on transistor 516. The memory array 434 is biased with all bit lines and word lines in a non-selected state to turn off the cell current Iscell. A current 554 is generated that discharges the bottom plate of capacitor 514. Current 554 includes the leakage current Ifcell and a second displacement current Irc2 present in the selected bit line 512 during the correction phase.

During the correction phase, the bottom plate of capacitor 522 is coupled to the reference bit line 536 by turning off transistor 524 and turning on transistor 528. The reference current Iref is removed during the correction phase. A current 556 is generated that discharges the bottom plate of capacitor 522. Current 556 includes a second displacement current Irc2 present in the reference bit line 432 during the correction phase.

After the correction phase, the results from both phases can be combined and compared by OTA 420. Looking at currents 550 and 554 together, it can be seen that they may be combined to remove the leakage current Ifcell. For example, combining current 554 with current 550 removes the leakage cell current Ifcell, leaving the selected cell current Iscell and the two displacement currents Irc1 and Irc2. Thus, OTA 420 receives a voltage at the first input 422 that includes the voltage resulting from the selected cell current Iscell and the displacement currents Irc1 and Irc2. OTA 420 receives a voltage at the second input 424 that includes the voltage resulting from the reference current Iref and the displacement currents Irc1 and Irc2. The voltage at the second input is compared with the voltage at the first input, providing an accurate comparison of Iscell to Iref. Both input voltages at 422 and 424 contain the voltages resulting from the displacement currents Irc1 and Irc2 such that they are cancelled out in the OTA comparison.

Figure 14:
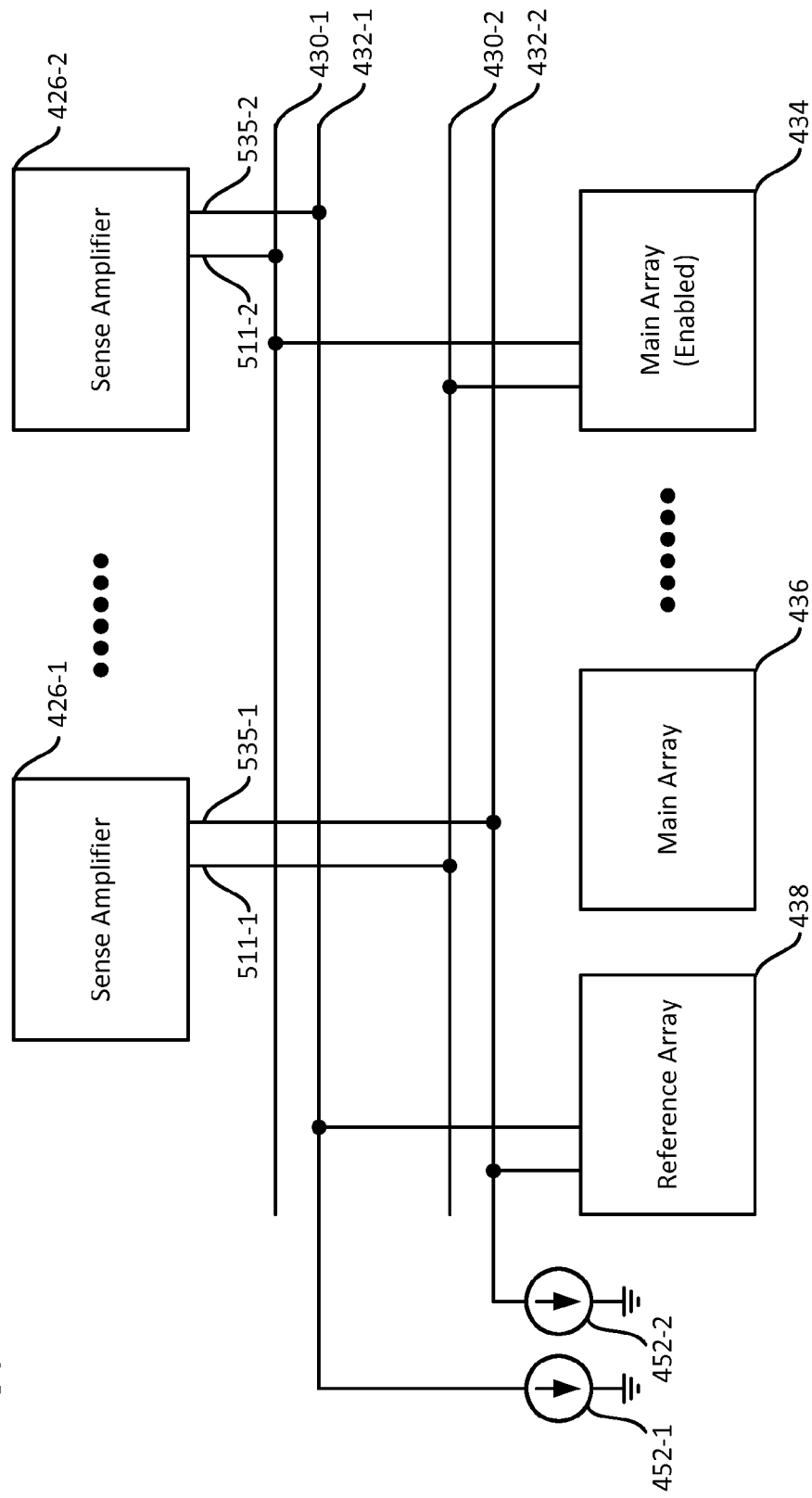
FIG. 14 is a block diagram depicting a memory including a reference bit line and reference memory array in accordance with one embodiment.

FIG. 14 is a depiction of one example of a memory architecture that can be used to provide a reference bit line and reference memory array. FIG. 14 depicts sense amplifiers 426-1 and 426-2. Although two sense amplifiers are depicted, many more sense amplifiers will typically be included as earlier described. For example, 128 sense amplifiers may be included in one exemplary implementation. Each sense amplifier includes one output 511 for connection to a selected bit line and one output 535 for connection to a reference bit line. FIG. 14 depicts selected bit lines 430-1, 430-2 which connect to the main memory arrays and reference bit lines 432-1, 432-1 which connect to the reference memory array. The reference bit lines can be formed close to and with similar dimensions to the selected bit lines so that they have matching or substantially matching RC characteristics. Reference bit line 432-1 is coupled to a first current source 452-1 and reference bit line 432-2 is coupled to a second current source 452-2. The current sources provide the reference current in the reference bit lines as described with respect to FIGS. 13A and 13B.

Sense amplifier 426-1 has a first output 511-1 coupled to a selected bit line 430-2 and a second output 535-1 coupled to a reference bit line 432-2. Sense amplifier 426-2 has a first output 511-2 coupled to selected bit line 430-1 and a second output 535-2 coupled to reference bit line 432-1. Three memory arrays 438, 436, and 434 are depicted by way of example, but typical implementations will include additional memory arrays. For example, one exemplary implementation may include a total of 60 memory arrays. Memory array 438 is a reference memory array in this example and includes connections to reference bit lines 432-1, 432-2. Memory arrays 436 and 434 are main memory arrays. In the depiction, memory array 434 is an enabled memory array and thus is coupled to selected bit lines 430-1 and 430-2.

As earlier described, the reference memory array 438 may be a dedicated memory array in one example that is used solely for reference purposes. In another example, none of the memory arrays of a device are dedicated reference memory arrays. Instead, one or more of the main memory arrays may be coupled to the reference bit lines to serve the purpose of a reference memory array. Any memory array that is disabled for a current read operation can be selected as a reference memory array. Selectable connections (not show) between the memory arrays and the selected and reference bit lines can be provided to enable the dynamic selection of a main memory array to serve as a reference memory array.

Figure 15:
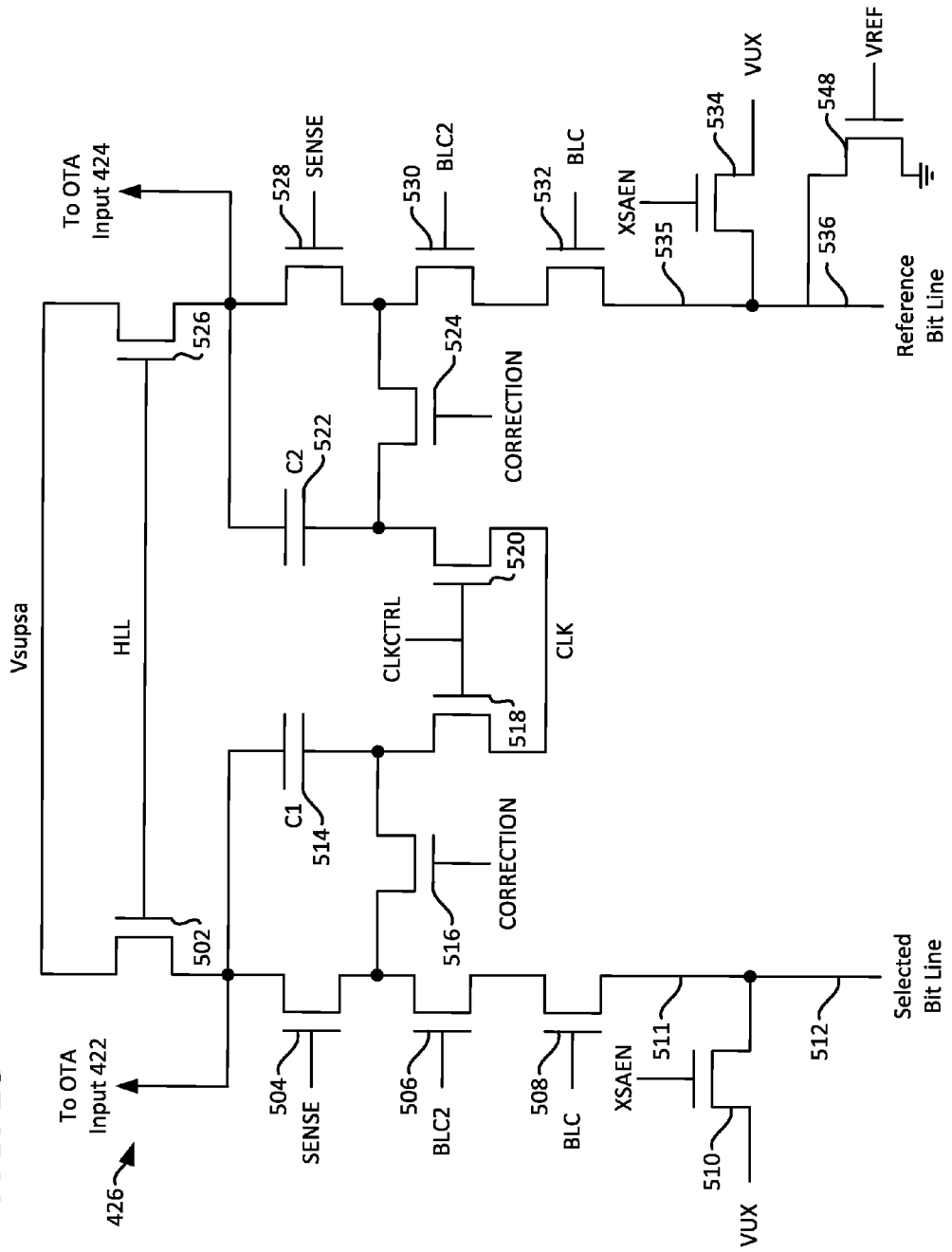
FIG. 15 is a circuit diagram depicting a sense amplifier in accordance with one embodiment.

FIG. 15 is a schematic diagram depicting a more detailed view of sense amplifier (SA) 426 according to one embodiment. SA 426 includes a first output 511 that is coupled to selected bit line 512 and a second output 535 that is coupled to the reference bit line 536. SA 426 includes two sense capacitors 514 and 522. The first sense capacitor 514 can be selectively coupled to the selected bit line 512 and the second sense capacitor 522 can be selectively coupled to the reference bit line. The top plate of capacitor 514 is coupled to a first input 422 of the OTA and the top plate of capacitor 522 is coupled to a second input 424 of the OTA. The top plate of capacitor 514 is configured to be selectively coupled to a voltage supply Vsupsa using a first transistor 502 and the top plate of capacitor 522 is configured to be selectively coupled to the voltage supply using a second transistor 526. Both transistors 502 and 526 have gates that are coupled to a control signal HLL. A first terminal of transistor 502 and a first terminal of transistor 526 are coupled to the voltage supply. A second terminal of transistor 502 is coupled to the top plate of capacitor 514 and a first terminal of a transistor 504 which receives a control signal SENSE at its gate. A second terminal of transistor 526 is coupled to the top plate of capacitor 522 and a first terminal of a transistor 528 which receives the control signal SENSE at its gate.

The bottom plate of capacitor 514 is coupled to a first terminal of a transistor 516. Transistor 516 receives a control signal CORRECTION at is gate and includes a second terminal coupled to a second terminal of transistor 504 and a first terminal of a transistor 506. Transistor 506 is controlled by a control signal BLC2 and includes a second terminal coupled to a first terminal of a transistor 508 which is controlled by a control signal BLC. Transistor 508 includes a second terminal coupled to the sense amplifier output 511. Sense amplifier output 511 is coupled to a first terminal of transistor 510 which is controlled by a signal XSAEN and which is coupled to a supply voltage VUX at its second terminal. The bottom plate of capacitor 514 is also coupled to a first terminal of a transistor 518 which has a gate that receives a control signal CLKCTRL. Transistor 518 includes a second terminal that is coupled to a voltage supply CLK.

The bottom plate of capacitor 522 is coupled to a first terminal of a transistor 524. Transistor 524 receives the control signal CORRECTION at is gate and includes a second terminal coupled to a second terminal of transistor 528 and a first terminal of a transistor 530. Transistor 530 includes a gate controlled by a control signal BLC2 and includes a second terminal coupled to a first terminal of a transistor 532 which is controlled by a control signal BLC at its gate. Transistor 532 includes a second terminal coupled to the sense amplifier output 535. Sense amplifier output 535 is coupled to a first terminal of transistor 534 which is controlled by a signal XSAEN at its gate and which is coupled to the supply voltage VUX at its second terminal. The bottom plate of capacitor 522 is also coupled to a first terminal of a transistor 520 which has a gate that receives the control signal CLKCTRL. Transistor 520 includes a second terminal that is coupled to a voltage supply CLK.

Figure 16:
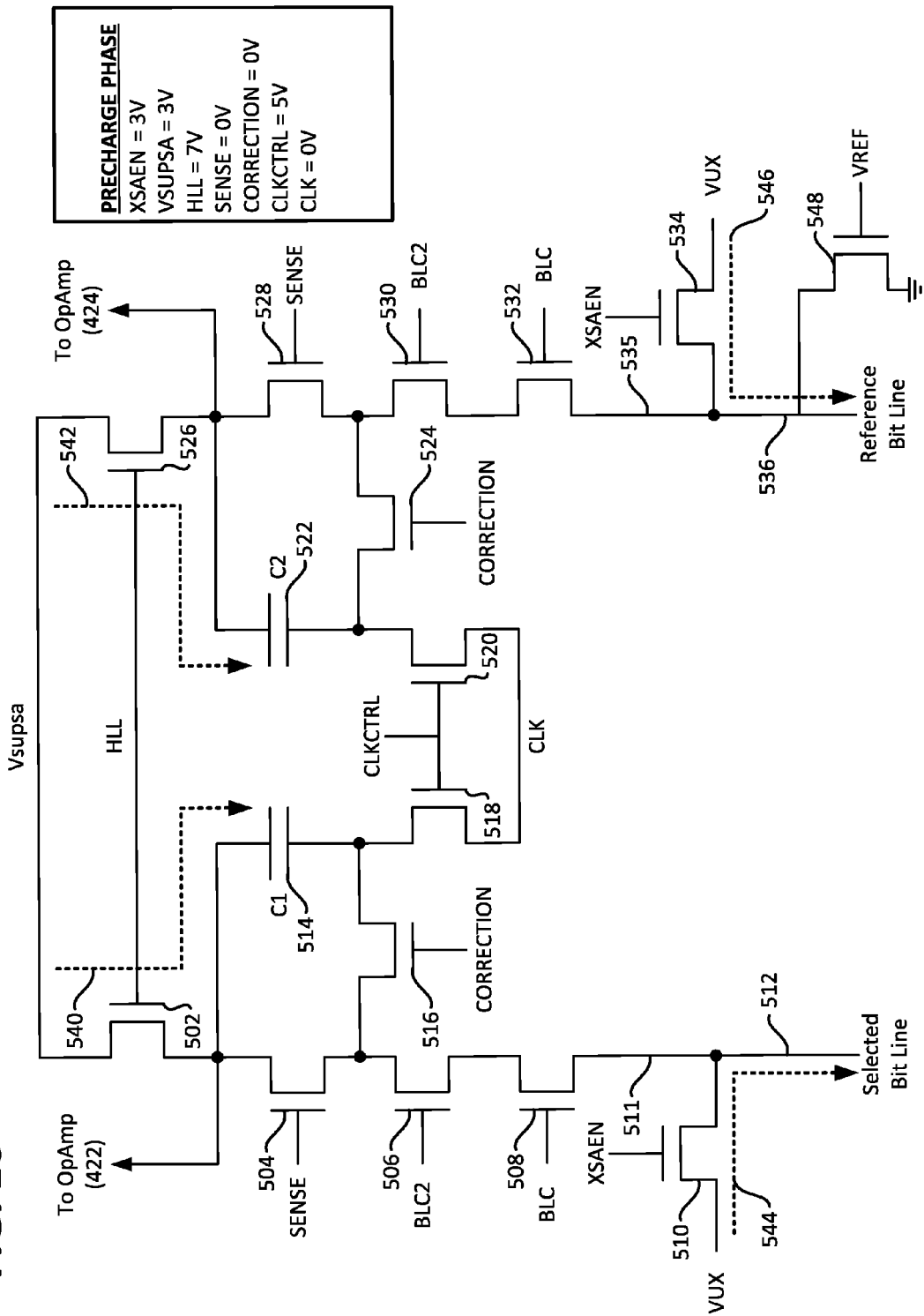
FIG. 16 is a circuit diagram depicting a sense amplifier in accordance with one embodiment during a precharge phase.

FIG. 16 depicts sense amplifier 426 during a precharge phase during which the sense capacitors 514 and 522 are precharged for sensing. Control signal XSAEN goes high (e.g., 3V) during the precharge phase. The control signal XSAEN turns on transistors 510 and 534. With transistor 510 on, a current 544 is driven in the selected bit line from the supply voltage VUX. VUX is equal to the read voltage Vrd in one example, which can be approximately 1V. Other voltages may be used. Similarly, a current 546 is driven in the reference bit line from the voltage supply VUX.

Transistors 502 and 526 are turned on by raising the control signal HLL to a high voltage level (e.g., 7V). The control signal SENSE is driven to a low voltage (e.g., 0V) to turn off transistors 504 and 528. By turning off transistors 504 and 528, the top plates of sense capacitors 514 and 522 are isolated from the selected bit line 512 and reference bit line 536, respectively. The control signal CORRECTION is also driven low to turn off transistors 516 and 524. By turning off transistors 516 and 524, the bottom plates of sense capacitors 514 and 522 are isolated from the selected bit line 512 and reference bit line 536, respectively. The control signal CLKCTRL is driven high (e.g., 5V) to turn on transistors 518 and 520. In this manner, the bottom plates of capacitors 514 and 522 are coupled to the voltage supply CLK. During the precharge phase, the voltage supply CLK is 0V so that the bottom plates of the capacitors are coupled to 0V. With these bias conditions, a current 540 is induced from the supply voltage Vsupsa through transistor 502 to the top plate of capacitor 514. A current 542 is induced from the voltage supply Vsupsa through transistor 526 to the top plate of capacitor 522.

Figure 17A:
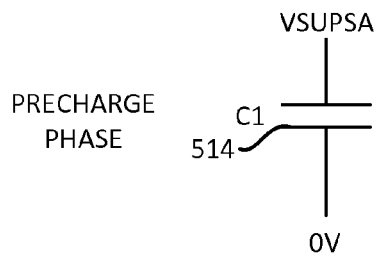
FIGS. 17A-17B depict sense capacitor voltages resulting from a precharge phase in accordance with one embodiment.
Figure 17B:
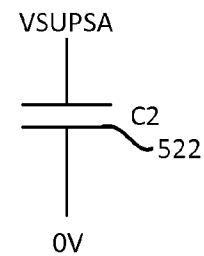

FIG. 17A depicts the resulting voltages at capacitor 514 from precharging. FIG. 17B depicts the resulting voltages at capacitor 522 from precharging. Current 540 precharges the top plate of capacitor 502 to the level of voltage supply Vsupsa. Current 542 precharges the top plate of capacitor 522 to the level of voltage supply Vsupsa.

Figure 18:
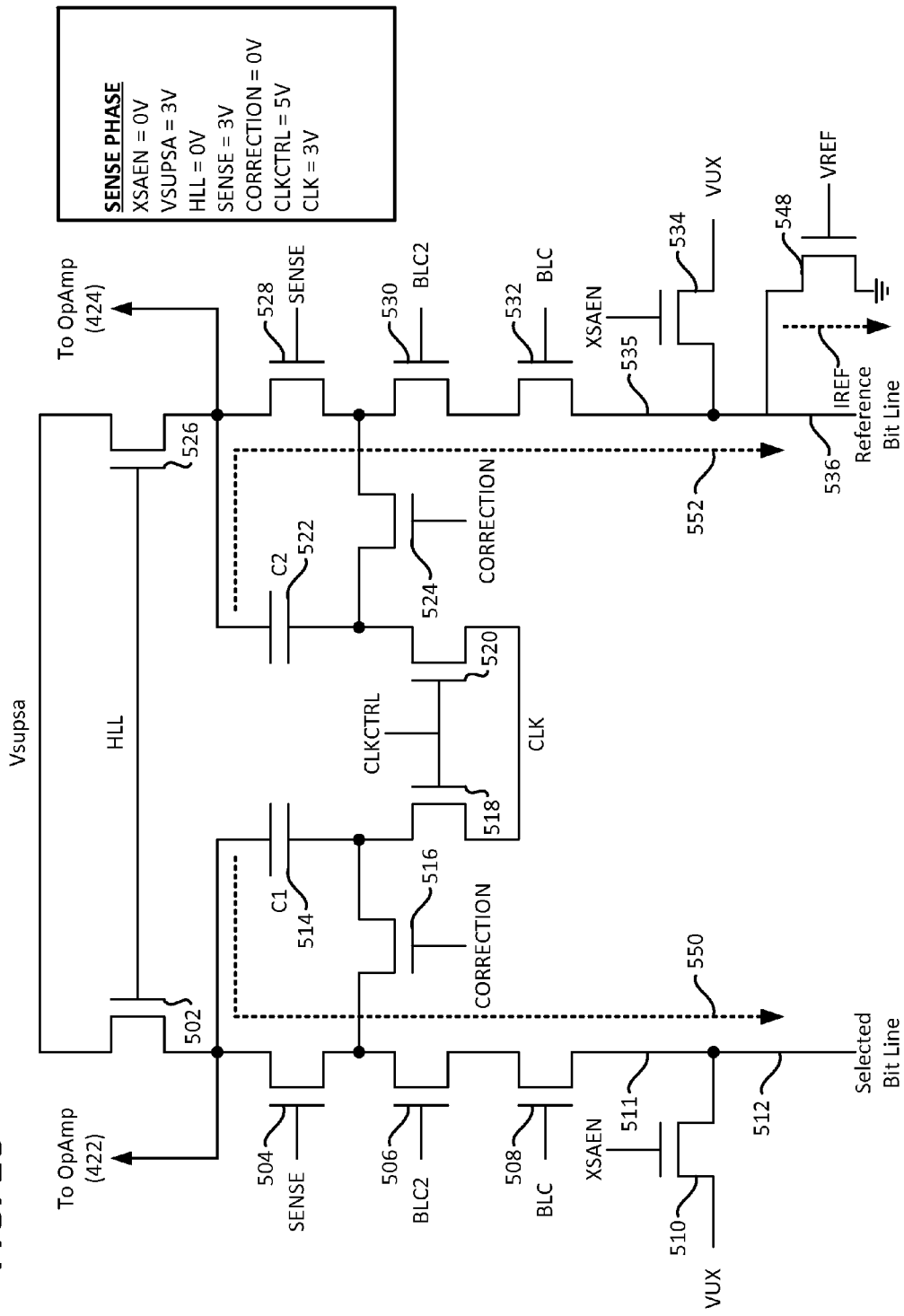
FIG. 18 is a circuit diagram depicting a sense amplifier in accordance with one embodiment during a sense phase.

FIG. 18 depicts sense amplifier 426 during a sense phase following the precharge phase shown in FIG. 16. Control signal HLL is driven low (e.g., 0V) during the sense phase to decouple or isolate the top plate of capacitors 514 and 522 from the voltage supply VSUPSA. The control signal SENSE is driven high (e.g., 3V) to turn on transistors 504 and 528. Control signal CORRECTION remains low so that the bottom plates of capacitors 514 and 522 are decoupled or isolated from the sense amplifier outputs 511 and 535, respectively. The control signal CLKCTRL remains high so that the bottom plates of capacitors 514 and 522 are coupled to the voltage supply CLK through transistors 518 and 520. During the sense phase, however, the voltage supply CLK is driven high (e.g., 3V). The control signals BLC and BLC2 are both driven high to turn on transistors 506, 508, 530, and 532. The control signal XSAEN is driven low so that the selected bit line 512 and reference bit line 536 are isolated from the voltage supply VUX.

Under the applied bias conditions, a path is created from the top plate of capacitor 514 through transistors 504, 506, and 508 to the selected bit line 512. A path is created from the top plate of capacitor 522 through transistors 528, 530, and 532 to the reference bit line 536. The top plate of capacitor 514 is then discharged to the selected bit line with a current 550 and the top plate of capacitor 522 is discharged to the reference bit line with a current 552. The amount of current 550 that discharges the top plate of capacitor 514 is given by Equation 1:

$$C1 \text{ Discharge Current} = I\text{scell} + I\text{fcell} + I\text{rc}1 \qquad \text{Equation 1}$$

Iscell is equal to the current through the selected memory cell connected to the selected bit line 512. Ifcell is equal to the current through the unselected memory cells that are connected to the selected bit line and the unselected word lines. Ifcell may be referred to as a leakage current as it results from current leaking through these unselected memory cells. Irc1 is a background noise current in the selected bit line as a result of the resistance and parasitic capacitances in the selected bit line.

Reference transistor 548 has a first terminal coupled to the reference bit line 536 and a second terminal coupled to ground. The reference transistor 548 includes a gate that is coupled to a control signal VREF. During the sense phase, VREF is driven high to turn on capacitor 548. With transistor 548 on, a path from the reference bit line to ground is provided. This results in a current IREF passing from the reference bit line to ground. Current 549 is a reference current IREF that is equal to the average of the on current and off current of a memory cell in one embodiment. Thus, IREF is a known value in one example. The total current 552 that discharges the top plate of capacitor 522 is then given by Equation 2:

$$C2 \text{ Discharge Current (Top Plate)} = I\text{REF} + I\text{rc}1 \qquad \text{Equation 2}$$

IREF is the reference current passing from the reference bit line to ground through transistor 548. Irc1 is the background noise current in the reference bit line as a result of the resistance and parasitic capacitances in the reference bit line. The background noise current in the selected bit line and the reference bit line are the same where the resistance and capacitance values of the two bit lines are the same. Thus, by forming the reference bit lines in the same way as the selected bit lines, the background noise currents will be the same.

Figure 19A:
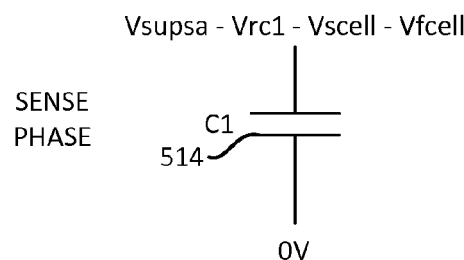
FIGS. 19A-19B depict sense capacitor voltages resulting from a sense phase in accordance with one embodiment.
Figure 19B:
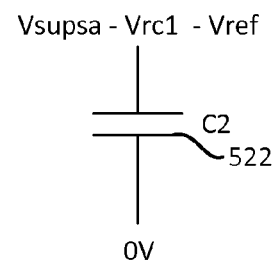

Current 550 in the selected bit line discharges the top plate of capacitor 502 from the precharge level of Vsupsa. The discharge will reduce the initial precharge level based on voltage components resulting from the displacement current, the selected cell current, and the leakage current. Current 552 in the reference bit line discharges the top plate of capacitor 522 from the precharge level of Vsupsa. The discharge will reduce the initial precharge level based on voltage components resulting from the displacement current and the reference current. The resulting voltage at the top plate of capacitor 514 is shown in FIG. 19A and given by Equation 3. The resulting voltage at the top plate of capacitor 522 is shown in FIG. 19B and given by Equation 4.

$$V\text{top}(C1) = V\text{supsa} - V\text{rc}1 - V\text{scell} - V\text{fcell} \qquad \text{Equation 3}$$

$$V\text{top}(C2) = V\text{supsa} - V\text{rc}1 - V\text{ref} \qquad \text{Equation 4}$$

The resulting voltage at the top plate of the capacitor is equal to the precharge level reduced by a voltage component Vrc1 that results from the displacement currents in the selected bit line during the sense phase, a voltage component Vscell that results from the selected cell current, and a voltage component Vfcell that results from the leakage current from the unselected memory cells along the selected bit line. The resulting voltage at the top plate of capacitor 522 is equal to the difference between the precharge level Vsupsa and a voltage component Vrc1 that results from the displacement currents in the reference bit line during the sense phase and a voltage component Vref that results from the reference current.

Figure 20:
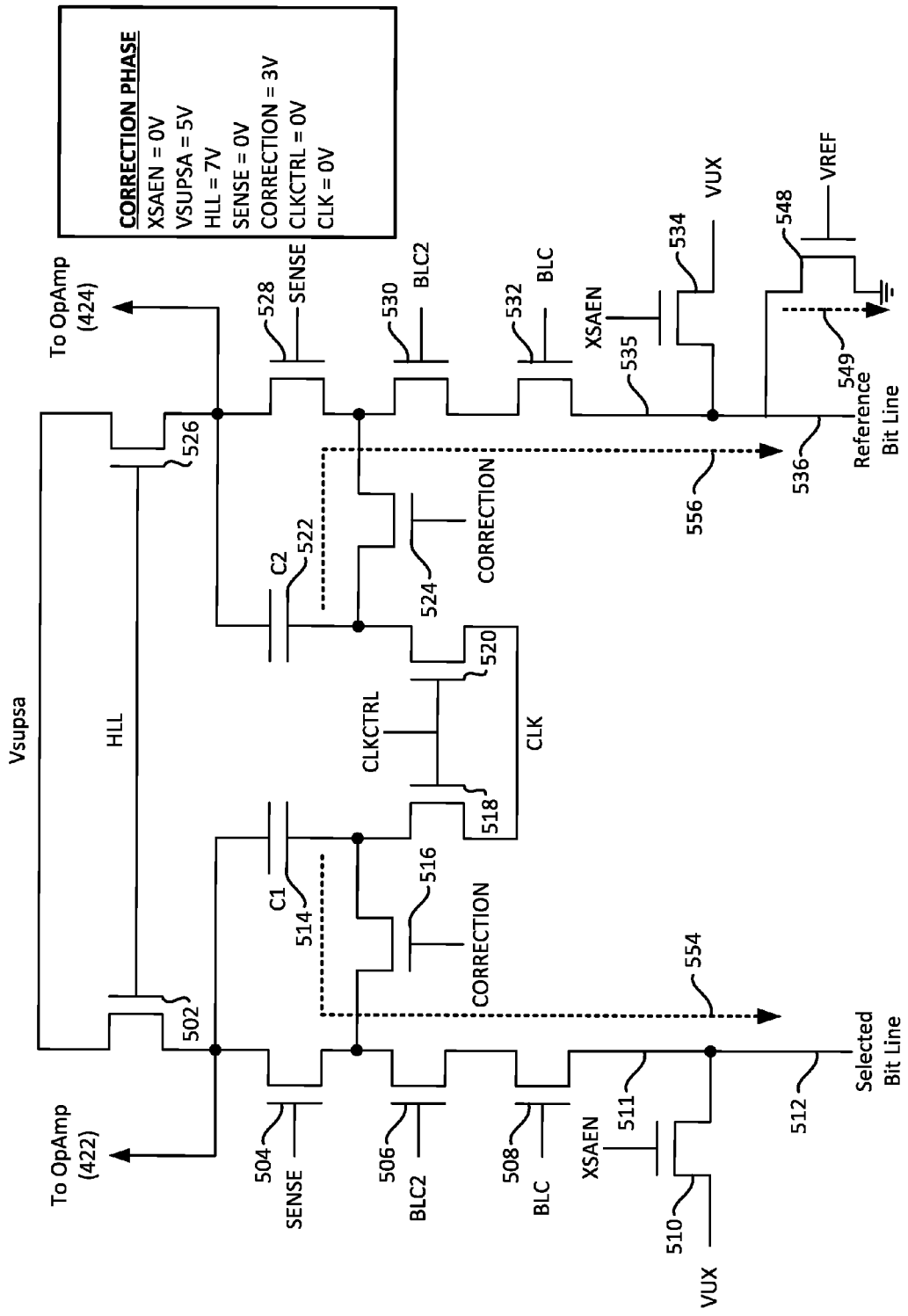
FIG. 20 is a circuit diagram depicting a sense amplifier in accordance with one embodiment during a correction phase.

FIG. 20 depicts sense amplifier 426 during a correction phase following the sense phase shown in FIG. 18. The selected bit line and the selected word line are driven to a non-select voltage (e.g., 0V) such that there is no on-cell current in either the selected bit line or the reference bit line. The reference cell current IREF and the selected cell current Iscell will be zero. Control signal HLL is again driven high while driving voltage supply Vsupsa to a positive voltage. Transistors 504 and 528 are turned off by driving SENSE low to isolate the top plates of capacitors 514 and 522 from the sense amplifier outputs 511 and 535. Control signal CLKCTRL is driven low to turn off transistors 518 and 520 so that the bottom plates of capacitors 514 and 516 are isolated from the voltage supply VUX. Control signal XSAEN is driven low to isolate the sense amplifier outputs 511 and 535 from the voltage supply VUX.

Control Signal CORRECTION is driven high to turn on transistors 516 and the 524. Control signals BLC and BLC2 are driven high to turn on transistors 506 and 508. This creates a path from the bottom plate of the first capacitor 514 to the first sense amplifier output 511 and a path from the bottom plate of the second capacitor 524 to the second sense amplifier output 535. Under these conditions, the bottom plate of the first capacitor 514 is discharged through the selected bit line and the bottom plate of the second capacitor 522 is discharged through the reference bit line 536. The bottom plate of the first capacitor 514 is discharged with a current as shown in Equation 5. The bottom plate of the second capacitor 522 is discharged with a current 556 given by Equation 6.

$$C1 \text{ Discharge Current (Bottom Plate)} = I\text{fcell} + I\text{rc}2 \qquad \text{Equation 5}$$

$$C2 \text{ Discharge Current (Bottom Plate)} = I\text{rc}2 \qquad \text{Equation 6}$$

Ifcell is the unselected memory cell leakage current. Irc2 is the displacement current in the selected bit line 512 or reference bit line 536 when driven to the unselected voltage level (e.g. 0V).

Figure 21A:
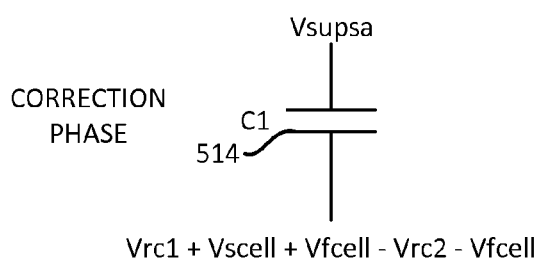
FIGS. 21A-21B depict sense capacitor voltages resulting from a correction phase in accordance with one embodiment.
Figure 21B:
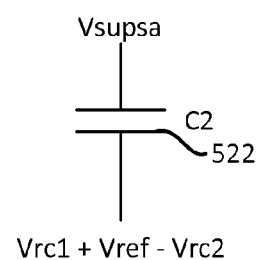

FIGS. 21A-21B depict the resulting voltages at capacitors 514 and 522 during the correction phase. The top plate of capacitor 514 and the top plate of capacitor 522 are driven to the high level of the voltage supply Vsupsa. With this biasing during the correction phase, the difference in the current voltage at the top plate of capacitor 514 (Vsupsa) and the voltage at the top plate during the sense phase is transferred to the bottom plate of capacitor. Moreover, the bottom plate develops a voltage based on the bias conditions of the correction. The resulting voltage at the bottom plate of capacitor 514 is shown in FIG. 21A and given by Equation 7. The resulting voltage at the bottom plate of capacitor 522 is shown in FIG. 21B and given by Equation 8.

$$Vbot(C1) = Vrc1 + Vscell + Vfcell - Vrc2 - Vfcell \quad \text{Equation 7}$$

$$Vbot(C2) = Vrc1 + Vref - Vrc2 \quad \text{Equation 8}$$

Vrc1 is the voltage resulting from the displacement current in the selected bit line or reference bit line during the sensing phase. Vscell is the voltage drop resulting from the selected cell current Iscell. Vrc2 is the voltage resulting from the displacement current in the selected bit line or the reference bit line during the correction phase. Vfcell is the voltage drop resulting from the leakage current.

As noted, Vfcell is generated during the sense phase and the correction phase at the selected bit line. Thus, the negative Vfcell value from the sense phase at the top plate is transferred to the bottom plate during the correction phase as a positive Vfcell value. During the correction phase, Vfcell is generated at the bottom plate of the first capacitor. The value of Vfcell from the top plate of capacitor 514 during the sense phase is thus cancelled out or removed as a result from the value Vfcell generated at the bottom plate of capacitor 514 during the sense phase.

Figure 23A:
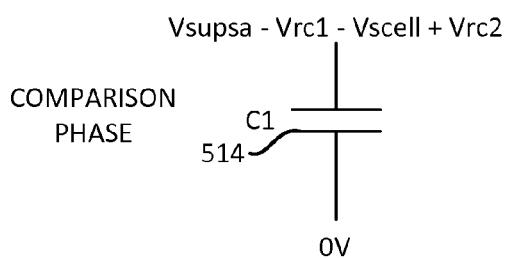
FIGS. 23A-23B depict sense capacitor voltages resulting from a comparison phase in accordance with one embodiment.
Figure 23B:
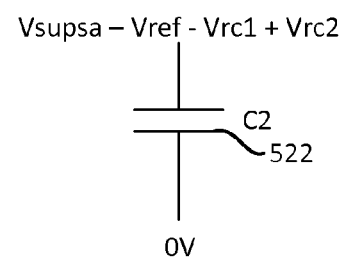
Figure 22:
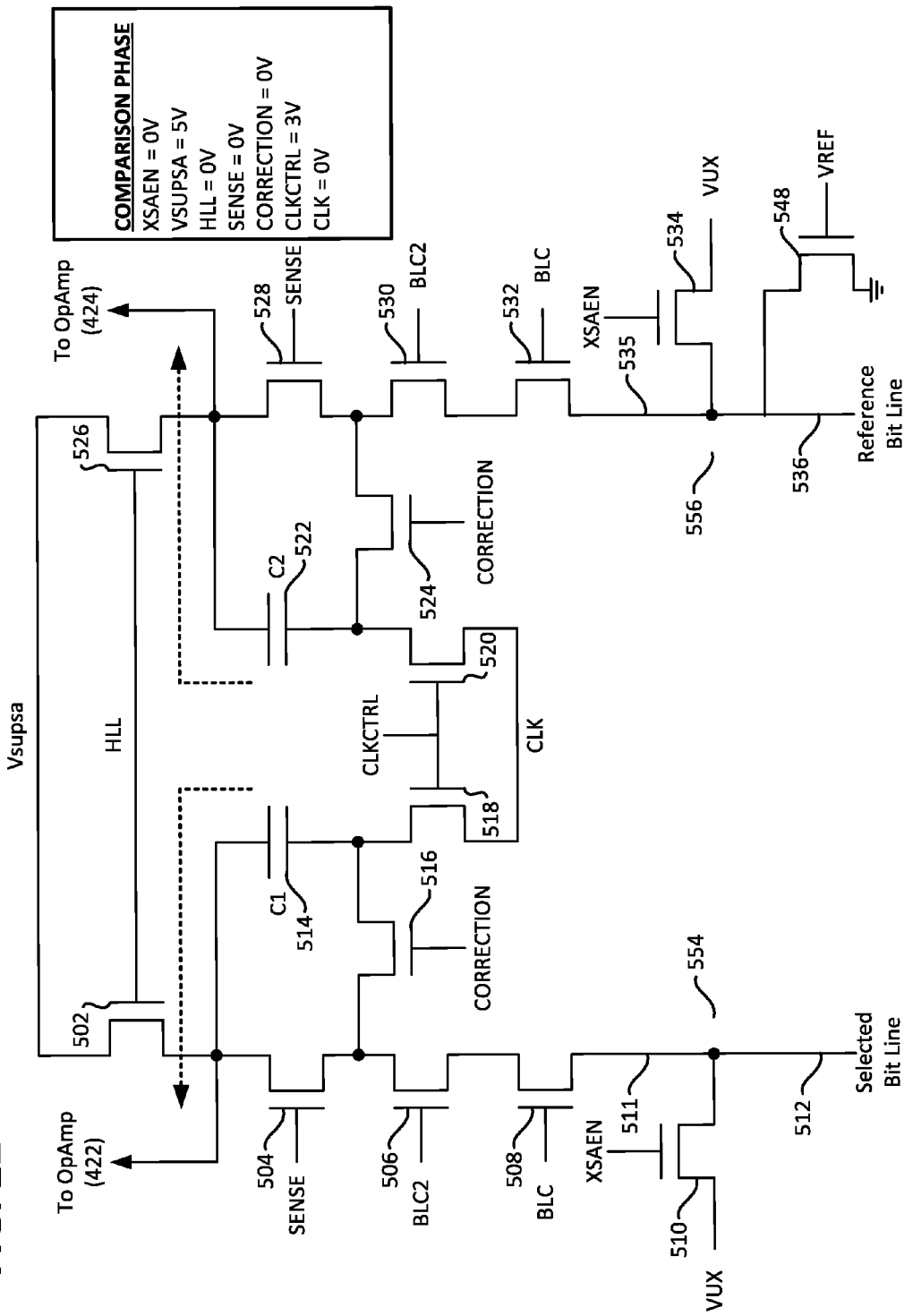
FIG. 22 is a circuit diagram depicting a sense amplifier in accordance with one embodiment during a comparison phase.

FIG. 22 depicts sense amplifier 426 during a comparison phase following the correction phase shown in FIG. 20. All bit lines and word lines remain at the non-select voltage (e.g., 0V) such that there is no on-cell current in either the selected bit line or the reference bit line. Control signals HLL, XSAEN, SENSE, and CORRECTION are driven low. The control signal CLKCTRL is driven high and the voltage supply CLK is set to 0V. In this manner, the bottom plates of capacitors 514 and 522 are coupled to 0V. With this biasing during the comparison phase, the difference in the current voltage at the bottom plate of capacitor 514 (0V) and the voltage at the bottom plate during the correction phase is transferred to the top plate of capacitor 514. The resulting voltage at the top plate of capacitor 514 is shown in FIG. 23A and given by Equation 9. The resulting voltage at the top plate of capacitor 522 is shown in FIG. 23B and given by Equation 10.

$$Vtop(C1) = Vsupsa - Vrc1 - Vscell + Vrc2 \quad \text{Equation 9}$$

$$Vtop(C2) = Vsupsa - Vref - Vrc1 + VRC2 \quad \text{Equation 10}$$

Referring again to FIGS. 13A and 13B, the voltages at the top plates of capacitors 514 and 522 are provided to the two inputs of the OTA. The voltage at the top plate of capacitor 514 is provided to the positive input 422 of OTA 420, while the voltage at the top plate of capacitor 522 is provided to the negative input 424 of OTA 420. OTA 420 will then generate an output based on a comparison of the two voltages. Referring to Equations 9 and 10, it can be seen that the voltage components Vsupsa, Vrc1, and Vrc2 are present in the voltage at the top plate of both capacitors. Thus, the voltage Vtop(C1) and Vtop(C2) only differ by the inclusion of the selected cell voltage Vsell in Vtop(C1) and the reference voltage Vref in Vtop(C2). Thus, the OTA can compare the two input values to compare the voltage at the selected memory cell Vscell with the reference voltage Vref. If the selected memory cell is on (conductive during sensing), the voltage Vscell at the first input will be lower than the reference voltage Vref at the second input. This results in OTA 420 generating an output equal to logic '0'. If the memory cell is off (not conductive during sensing), the voltage Vscell at the first input will be higher than the reference voltage Vref. This results in OTA 420 generating an output equal to logic '1'.

Figure 25:
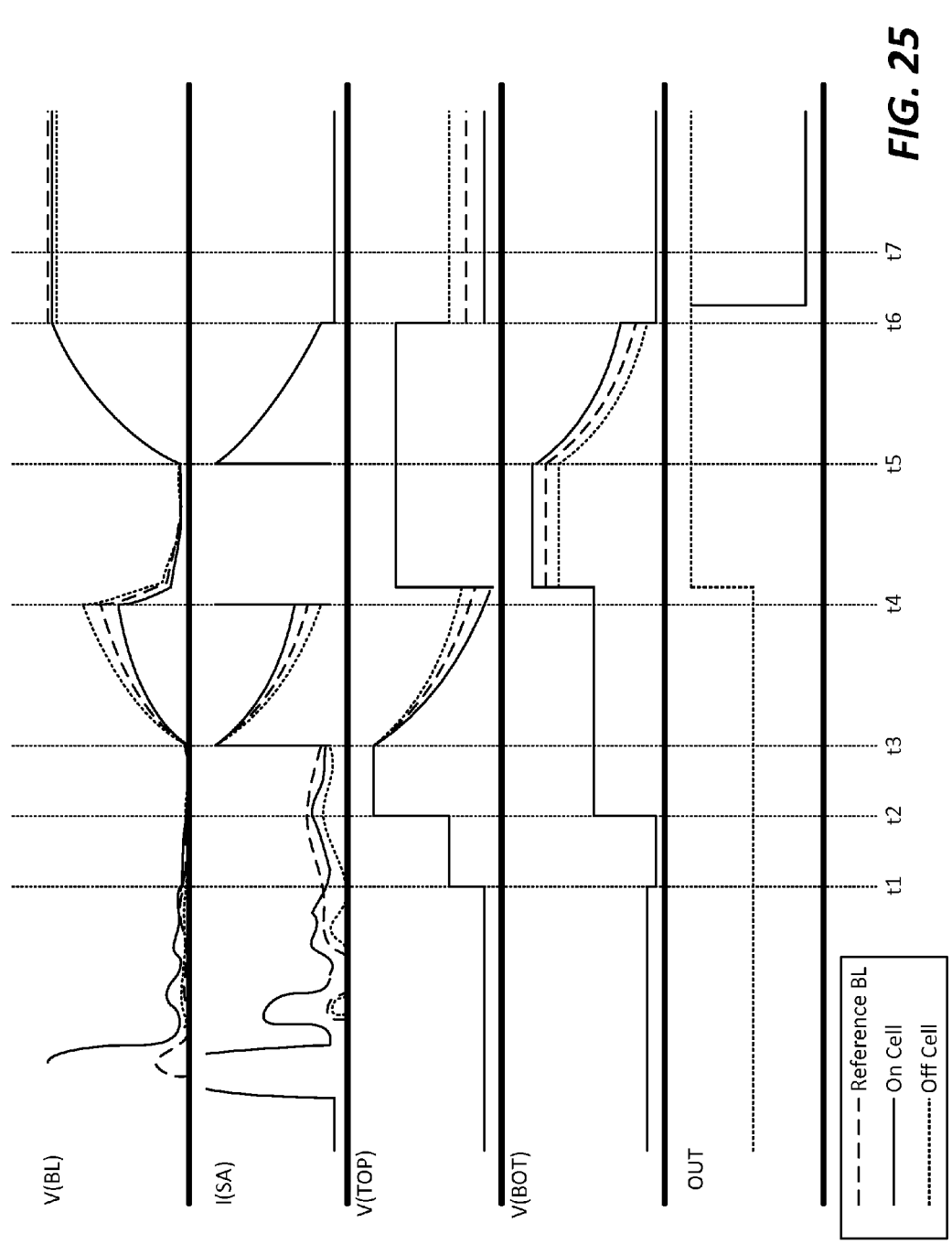
FIG. 25 is a timing diagram depicting a set of voltages and currents resulting in a memory during a read operation in accordance with one embodiment.

FIG. 24 is a timing diagram depicting control signals of sense amplifier 426 during a read operation according to one embodiment. FIG. 25 is a timing diagram depicting a set of voltages and currents associated with sense amplifier 426 that result from the control signals shown in FIG. 24. FIGS. 24 and 25 include corresponding time demarcations to illustrate the effects of the control signals. Prior to time t1, XSAEN is driven high to connect the selected bit line and the reference bit line to VUX. This results in bit line voltages V(BL) and sense amplifier currents ISA as shown in FIG. 25. The solid lines in FIG. 25 correspond to an on-cell (low resistance), the dotted lines correspond to an off cell (high resistance), and the dashed lines correspond to the reference bit line. The bit line voltage VBL for an on cell rises to a high level, then settles to a relatively low level. Similarly the sense amplifier current ISA for an on cell rises to a high level, then settles to a relatively low level. The bit line voltages and sense amplifier currents for the reference bit line and the off cells behave similarly, but at lower levels. The bit line voltage and sense amplifier current of the reference bit line are higher than those of the off cell, but lower than those of the on cell.

At time t1, the precharge phase begins by driving HLL high to turn on transistors 502, 526 and driving CLKCTRL high to turn on transistors 518 and 520. XSAEN is also high to drive the current in the selected bit line and the reference bit line from VUX. The remaining control signals are driven low. The top plates of sense capacitors 514 and 522 are both precharged as shown in FIG. 25. The voltage V(TOP) at the top plate of the capacitors rises to an intermediate level at time t1 when HLL is driven high to connect the top plates to the supply voltage Vsupsa.

At time t2, HLL is driven low to decouple the top plate of the sense capacitors from the voltage supply. Also at time t2, the voltage supply CLK goes high to boost the voltage at the top plate of each capacitor to a high level. The voltage at the top plate of the capacitors rises to a high level at time t2 when the bottom plate of the capacitors are coupled to the voltage supply CLK and CLK is driven high. The voltage V(BOT) at the bottom plate of the capacitors rises to an intermediate level when the bottom plates are coupled to CLK at the high level.

At time t3, the sense phase begins. XSAEN is driven low to decouple the selected bit line and the reference bit line from the voltage supply VUX. Also at time t3, SENSE is driven high to couple the top plate of capacitor 514 to the selected bit line and the top plate of capacitor 522 to the reference bit line. The control signal CLKCTRL remains high to couple the bottom plate of each capacitor to the voltage supply CLK which is driven high. As a result, the top plate of capacitor 514 is discharged through the selected bit line and the top plate of capacitor 522 is discharged through the reference bit line.

As shown in FIG. 25, the bit line voltage rises in accordance with the state of the corresponding memory cell or bit line. The bit line voltage V(BL) climbs to a high level between time t3 and time t4 for an off cell and the sense amplifier current ISA for an off cell drops to a low level. The bit line voltage climbs to an intermediate level between time t3 and time t4 for the reference bit line and the sense amplifier current ISA for the reference bit line drops to an intermediate level. The bit line voltage climbs to a low level between time t3 and time t4 for an on cell and the sense amplifier current ISA for the on cell drops to a higher level than that of the off cell or reference bit line.

The top plate of the capacitors are discharged through the respective bit lines, resulting in drop in a voltage V(TOP). If a memory cell is on during the sense phase, it will cause a large current in the sense amplifier which will discharge the top plate of the corresponding capacitor to a low value at time t4. The top plate of a capacitor corresponding to the reference bit line will be discharged less by a smaller current to a level above that of an on-cell. If a memory cell is off during the sense phase, it will cause a small current in the sense amplifier which will discharge the top plate of the corresponding capacitor to a level above that of the reference bit line and on-cell bit line.

At time t4, XSAEN goes high again to couple each bit line to VUX. HLL is driven high, while CLKCTRL, CLK, and SENSE are driven low. The voltage V(BL) at each bit line is charged to VUX. By coupling the top plates of each capacitor to Vsupsa via the HLL control signal, the top plates of each capacitor are charged again to the Vsupsa voltage level. As a result, the existing charge at the top plate of each capacitor resulting from the sense phase is transferred to the bottom plate of the capacitor. The voltage V(BOT) at the bottom plate of a capacitor corresponding to an on cell rises to a high level. The voltage V(BOT) for a capacitor corresponding to the reference bit line rises to an intermediate level and the voltage V(BOT) for a capacitor corresponding to an off cell rises to a low level.

At time t5, the correction phase begins. XSAEN is driven low again to decouple each bit line from VUX. HLL remains high so that the top plate of each capacitor is coupled to the voltage supply VSUPSA. The control signal CORRECTION is driven high to couple the bottom plate of capacitor 514 to the selected bit line and to couple the bottom plate of capacitor 522 to the reference bit line. As a result, the voltage at the top plate of capacitor 514 is transferred to the bottom plate of capacitor 514. Capacitor 514 is discharged based on the leakage current Ifcell of the unselected cells and the displacement current Irc2 of the selected bit line. Capacitor 522 is discharged based on the displacement current Irc2 of the reference bit line. The selected and nonselected word lines and bit lines are at 0V so the discharge of capacitor 514 is not based on the selected cell current Iscell and the discharge of capacitor 522 is not based on the reference current IREF.

As shown in FIG. 25 at time t5, the bit line voltage V(BL) for each bit line rises to a high level as the capacitors are discharged through the bit line. The current I(SA) in each bit line drops to a low level. The top plate of each capacitor remains coupled to the voltage supply Vsupsa so that they are held at a constant voltage during the correction phase. The voltage V(BOT) at the bottom plate of each capacitor is lowered according to the state of the corresponding bit line. The voltage at the bottom plate of a capacitor corresponding to an off cell is lowered to a low level between time t5 and t6. The voltage at the bottom plate of a capacitor corresponding to the reference bit line is lowered to an intermediate level, and the voltage at the bottom plate of a capacitor corresponding to an on-cell is lowered to a level higher than that of the off cell or reference bit line.

At time t6, control signal CORRECTION is driven low to decouple the lower plate of each capacitor from the corresponding bit line. HLL is driven low to decouple the top plate of each capacitor form the voltage supply Vsupsa. CLKCTRL is driven high to couple the bottom plate of each capacitor to the voltage supply CLK which remains at 0V. As a result, the voltage at the bottom plate of capacitor 514 is transferred to the top plate of capacitor 514 and the voltage at the bottom plate of capacitor 522 is transferred to the top plate of capacitor 522. As earlier described, the voltage at capacitor 514 has the effects of leakage current from the unselected memory cells removed as a result of the correction phase. Additionally, the voltage at capacitor 514 includes the displacement voltages Vrc1 and Vrc2. Similarly, the voltage at capacitor 522 includes the displacement voltages Vrc1 and Vrc2. Accordingly, the voltage at the top plate of capacitor 514 can be provided to a first input of an OTA and the voltage at the top plate of capacitor 522 can be provided to a second input of the OTA so that the voltage resulting from selected cell current can be compared with the reference voltage Vref. The OTA generates a logical output RD_DATA at time t7 based on the comparison of the two voltages.

As shown in FIG. 25 at time t6, the current ISA in each bit line drops to a low level as does the voltage V(BOT) at the bottom plate of each capacitor. The previous charge at the bottom plate of each capacitor is transferred to the top plate of each capacitor based on its difference from Vsupsa. As such, the voltage V(TOP) at the top plate of a capacitor corresponding to an off cell rises to high level. The voltage V(TOP) corresponding to the reference bit line rises to an intermediate level and the voltage V(TOP) corresponding to an on cell rises to a low level. A strobe signal is raised to a high level so that the voltages at the top plate of each capacitor for a selected bit line are compared with the voltage at the top plate of a capacitor for the reference bit line using the OTA. As such, the OTA will generate an output OUT based on a comparison of the two voltages. If the voltage V(TOP) for a selected bit line is less than the voltage V(TOP) for the reference bit line, the OTA generates a low level output (e.g., logic '0') indicating that the corresponding memory cell was on during the sense phase. If the voltage V(TOP) for a selected bit line is greater than the voltage V(TOP) for the reference bit line, the OTA generates a high level output (e.g., logic '1') indicating that the corresponding memory cell was off during the sense phase.

Thus, there is described a non-volatile storage system that includes a sense amplifier including a first output selectively coupled to a selected bit line and a second output selectively coupled to a reference bit line, a first capacitor including a first plate selectively coupled to the first output and a second plate selectively coupled to the first output. The first plate of the first capacitor is selectively coupled to a voltage supply. The system includes a second capacitor including a first plate selectively coupled to the second output and a second plate selectively coupled to the second output. The first plate of the second capacitor is selectively coupled to the voltage supply. The system includes an operational amplifier having a first input that is selectively coupled to the first plate of the first capacitor and a second input that is selectively coupled to the first plate of the second capacitor.

A method of sensing in non-volatile memory is described that includes coupling a first plate of a first capacitor and a first plate of a second capacitor to a voltage supply during a preset phase. The first capacitor configured for selective coupling to a selected bit line and the second capacitor configured for selective coupling to a reference bit line. The method includes decoupling the first plate of the first capacitor and the first plate of the second capacitor from the voltage supply during a sense phase, coupling the first plate of the first capacitor to the selected bit line and the first plate of the second capacitor to the reference bit line during the sense phase, coupling the first plate of the first capacitor and the first plate of the second capacitor to the voltage supply during a correction phase, coupling the second plate of the first capacitor to the selected bit line and the second plate of the second capacitor to the reference bit line during the correction phase, and comparing a first voltage of the first plate of the first capacitor with a second voltage of the first plate of the second capacitor using an operational amplifier during a comparison phase.

A non-volatile storage system is described that includes a first capacitor having a first plate and a second plate, a second capacitor having a first plate and a second plate, a first transistor having a first terminal coupled to a voltage supply, a second terminal coupled to the first plate of the first capacitor, and a gate coupled to a first control signal, a second transistor having a first terminal coupled to the voltage supply, a second terminal coupled to a first plate of a second capacitor and a gate coupled to the first control signal, a third transistor having a first terminal coupled to the second plate of the first capacitor, a second terminal configured for selectable communication with a selected bit line, and a gate coupled to a second control signal, and a fourth transistor having a first terminal coupled to the second plate of the second capacitor, a second terminal configured for selectable communication with a reference bit line, and a gate coupled to the second control signal.

A method of sensing in non-volatile storage is described that includes precharging a first plate of a first capacitor and a first plate of a second capacitor, discharging the first plate of the first capacitor through a selected bit line and discharging the first plate of the second capacitor through a reference bit line, and after discharging the first plate of the first capacitor and the first plate of the second capacitor, discharging a second plate of the first capacitor through the selected bit line and discharging a second plate of the second capacitor through the reference bit line. The method includes after discharging the second plate of the first capacitor and discharging the second plate of the second capacitor, transferring a first voltage from the second plate of the first capacitor to the first plate of the first capacitor and transferring a second voltage from the second plate of the second capacitor to the first plate of the second capacitor. The method includes after transferring the first voltage and the second voltage, providing a first comparison voltage from the first plate of the first capacitor to a first input of an operational amplifier and providing a second comparison voltage from the first plate of the second capacitor to a second input of the operational amplifier.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A non-volatile storage system, comprising:
   a sense amplifier including a first output selectively coupled to a selected bit line and a second output selectively coupled to a reference bit line;
   a first capacitor including a first plate selectively coupled to the first output and a second plate selectively coupled to the first output, the first plate of the first capacitor is selectively coupled to a voltage supply;
   a second capacitor including a first plate selectively coupled to the second output and a second plate selectively coupled to the second output, the first plate of the second capacitor is selectively coupled to the voltage supply; and
   an operational amplifier having a first input that is selectively coupled to the first plate of the first capacitor and a second input that is selectively coupled to the first plate of the second capacitor.

2. The non-volatile storage system of claim 1, further comprising:
   a first transistor coupled between the first plate of the first capacitor and the voltage supply;
   a second transistor coupled between the second plate of the first capacitor and the selected bit line;
   a third transistor coupled between the first plate of the second capacitor and the voltage supply; and
   a fourth transistor coupled between the second plate of the second capacitor and the reference bit line.

3. The non-volatile storage system of claim 2, wherein:
   the first transistor includes a first terminal coupled to the voltage supply, a second terminal coupled to the first plate of the first capacitor, and a gate coupled to a first control signal; and
   the third transistor includes a first terminal coupled to the voltage supply, a second terminal coupled to the first plate of the second capacitor, and a gate coupled to the first control signal.

4. The non-volatile storage system of claim 3, wherein:
   the first control signal turns on the first transistor and the third transistor during a precharge phase;
   the first transistor couples the voltage supply to the first plate of the first capacitor to precharge the first capacitor during the precharge phase; and
   the third transistor couples the voltage supply to the first plate of the second capacitor to precharge the second capacitor during the precharge phase.

5. The non-volatile storage system of claim 4, wherein:
   the second transistor includes a first terminal coupled to the second plate of the first capacitor, a second terminal coupled to one or more select transistors for the selected bit line, and a gate coupled to a second control signal; and
   the fourth transistor includes a first terminal coupled to the second plate of the second capacitor, a second terminal coupled to one or more select transistors for the reference bit line, and a gate coupled to the second control signal.

6. The non-volatile storage system of claim 5, wherein:
   the second control signal turns off the second transistor and the fourth transistor during the precharge phase;
   the second transistor isolates the second plate of the first capacitor from the selected bit line during the precharge phase; and
   the fourth transistor isolates the second plate of the second capacitor from the reference bit line during the precharge phase.

7. The non-volatile storage system of claim 6, wherein:
   the first control signal turns off the first transistor and the third transistor during a sense phase; and
   the second control signal turns off the second transistor and the fourth transistor during the sense phase;
   the first plate of the first capacitor discharges to the selected bit line through the one or more select transistors for the selected bit line during the sense phase; and the first plate of the second capacitor discharges to the reference bit line through the one or more select transistors for the reference bit line during the sense phase.

8. The non-volatile storage system of claim 7, further comprising:
a reference transistor having a first terminal coupled to the reference bit line, a second terminal coupled to ground, and a gate coupled to a third control signal; and
wherein the third control signal turns on the reference transistor during the sense phase such that the reference transistor passes a reference current from the reference bit line to ground.

9. The non-volatile storage system of claim 8, wherein:
the first plate of the first capacitor discharges to the selected bit line with a first current based on a selected cell current of a selected cell coupled to the selected bit line, an unselected cell current of an unselected cell coupled to the selected bit line, and a first displacement current of the selected bit line; and
the first plate of the second capacitor discharges to the reference bit line with a second current based on the reference current and a first displacement current of the reference bit line.

10. The non-volatile storage system of claim 9, wherein:
the first control signal turns on the first transistor and the third transistor during a correction phase following the sense phase;
the first transistor couples the voltage supply to the first plate of the first capacitor to charge the first plate of the first capacitor during the correction phase;
the third transistor couples the voltage supply to the first plate of the second capacitor to charge the first plate of the second capacitor during the correction phase;
the second control signal turns on the second transistor and the fourth transistor during the correction phase;
the second plate of the first capacitor discharges to the selected bit line through the third transistor during the correction phase; and
the second plate of the second capacitor discharges to the reference bit line through the fourth transistor during the correction phase.

11. The non-volatile storage system of claim 10, wherein:
during correction phase, the second plate of the first capacitor discharges to the selected bit line with a third current based on the unselected cell current of the unselected cell coupled to the selected bit line and a second displacement current of the selected bit line; and
during the correction phase, the second plate of the second capacitor discharges to the reference bit line with a fourth current based on a second displacement current of the reference bit line.

12. The non-volatile storage system of claim 11, further comprising:
a fifth transistor having a first terminal coupled to the second plate of the first capacitor, a second terminal coupled to a second voltage supply, and a gate coupled to a fourth control signal;
a sixth transistor having a first terminal coupled to the second plate of the second capacitor, a second terminal coupled to the second voltage supply, and a gate coupled to the fourth control signal;
wherein the fourth control signal turns on the fifth transistor and the sixth transistor during a comparison phase following the correction phase; and
wherein the second voltage supply is zero volts during the comparison phase.

13. The non-volatile storage system of claim 12, wherein:
the second plate of the first capacitor discharges to a first correction voltage during the correction phase;
the second plate of the second capacitor discharges to a second correction voltage during the correction phase;
the first plate of the first capacitor discharges to a first comparison voltage during the comparison phase based on a difference between a level of the first voltage supply and the first correction voltage;
the second plate of the second capacitor discharges to a second comparison voltage during the comparison phase based on a difference between the level of the first supply voltage and the second correction voltage; and
the operational amplifier generates an output during the comparison phase based on a difference between the first comparison voltage and the second comparison voltage.

14. The non-volatile storage system of claim 1, further comprising:
a monolithic three-dimensional non-volatile memory array including one or more memory cells coupled to the selected bit line.

15. The non-volatile storage system of claim 14, wherein the monolithic three-dimensional non-volatile memory array is a first monolithic three-dimensional non-volatile memory array, the non-volatile storage system further comprising:
a second monolithic three-dimensional non-volatile memory array including one or more memory cells coupled to the reference bit line.

16. A method of sensing in non-volatile storage, comprising:
coupling a first plate of a first capacitor and a first plate of a second capacitor to a voltage supply during a preset phase, the first capacitor configured for selective coupling to a selected bit line and the second capacitor configured for selective coupling to a reference bit line;
decoupling the first plate of the first capacitor and the first plate of the second capacitor from the voltage supply during a sense phase;
coupling the first plate of the first capacitor to the selected bit line and the first plate of the second capacitor to the reference bit line during the sense phase;
coupling the first plate of the first capacitor and the first plate of the second capacitor to the voltage supply during a correction phase;
coupling the second plate of the first capacitor to the selected bit line and the second plate of the second capacitor to the reference bit line during the correction phase; and
comparing a first voltage of the first plate of the first capacitor with a second voltage of the first plate of the second capacitor using an operational amplifier during a comparison phase.

17. The method of claim 16, further comprising:
decoupling the second plate of the first capacitor from the selected bit line and the second plate of the second capacitor from the reference bit line during the precharge phase.

18. The method of claim 17, further comprising:
decoupling the second plate of the first capacitor from the selected bit line and the second plate of the second capacitor from the reference bit line during the sense phase.

19. The method of claim 18, further comprising:
coupling the first plate of the first capacitor and the first plate of the second capacitor to the voltage supply during the comparison phase; and coupling the second plate of the first capacitor and the second plate of the second capacitor to zero volts during the comparison phase.

20. The method of claim 19, further comprising:
coupling the reference bit line to ground through a first transistor during the sense phase to generate a reference current in the reference bit line.

21. The method of claim 20, further comprising:
transferring a first correction voltage from the second plate of the first capacitor to the first plate of the first capacitor during the correction phase; and
transferring a second correction voltage from the second plate of the second capacitor to the first plate of the second capacitor during the correction phase.

22. The method of claim 21, wherein:
the first voltage of the first plate of the first capacitor during the comparison phase is based on a difference between a level of the voltage supply and the first correction voltage; and
the second voltage of the first plate of the second capacitor during the comparison phase is based on a difference between a level of the voltage supply and the second correction voltage.

23. A non-volatile storage system, comprising:
a first capacitor having a first plate and a second plate;
a second capacitor having a first plate and a second plate;
a first transistor having a first terminal coupled to a voltage supply, a second terminal coupled to the first plate of the first capacitor, and a gate coupled to a first control signal;
a second transistor having a first terminal coupled to the voltage supply, a second terminal coupled to a first plate of a second capacitor and a gate coupled to the first control signal;
a third transistor having a first terminal coupled to the second plate of the first capacitor, a second terminal configured for selectable communication with a selected bit line, and a gate coupled to a second control signal; and
a fourth transistor having a first terminal coupled to the second plate of the second capacitor, a second terminal configured for selectable communication with a reference bit line, and a gate coupled to the second control signal.

24. The non-volatile storage system of claim 23, further comprising:
an operational amplifier having a first input coupled to the first plate of the first capacitor and a second input coupled to the second plate of the second capacitor.

25. The non-volatile storage system of claim 24, further comprising:
a fifth transistor having a first terminal coupled to the reference bit line, a second terminal coupled to ground, and a gate coupled to a third control signal.

26. A method of sensing in non-volatile storage, comprising:
precharging a first plate of a first capacitor and a first plate of a second capacitor;
discharging the first plate of the first capacitor through a selected bit line and discharging the first plate of the second capacitor through a reference bit line;
after discharging the first plate of the first capacitor and the first plate of the second capacitor, discharging a second plate of the first capacitor through the selected bit line and discharging a second plate of the second capacitor through the reference bit line;
after discharging the second plate of the first capacitor and discharging the second plate of the second capacitor, transferring a first voltage from the second plate of the first capacitor to the first plate of the first capacitor and transferring a second voltage from the second plate of the second capacitor to the first plate of the second capacitor; and
after transferring the first voltage and the second voltage, providing a first comparison voltage from the first plate of the first capacitor to a first input of an operational amplifier and providing a second comparison voltage from the first plate of the second capacitor to a second input of the operational amplifier.

27. The method of claim 26, further comprising:
coupling the first plate of the first capacitor to a supply voltage such that transferring the first voltage generates the first comparison voltage based on a difference between a level of the voltage supply and the first voltage; and
coupling the first plate of the second capacitor to the supply voltage such that transferring the second voltage generates the second comparison voltage based on a difference between the level of the voltage supply and second voltage.

* * * * *